(12) United States Patent
Juengling

(10) Patent No.: US 8,148,776 B2
(45) Date of Patent: Apr. 3, 2012

(54) TRANSISTOR WITH A PASSIVE GATE

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 288 days.

(21) Appl. No.: 12/210,305

(22) Filed: Sep. 15, 2008

(65) Prior Publication Data

US 2010/0066440 A1 Mar. 18, 2010

(51) Int. Cl.
*H01L 29/76* (2006.01)
(52) U.S. Cl. .................... 257/331; 257/330; 257/E21.43
(58) Field of Classification Search ............. 257/E21.43, 257/E21.619, E21.634, 330–332
See application file for complete search history.

(56) References Cited

U.S. PATENT DOCUMENTS

| | | | |
|---|---|---|---|
| 3,885,861 A | 5/1975 | Farnsworth et al. | |
| 5,160,987 A | 11/1992 | Pricer et al. | |
| 5,196,910 A | 3/1993 | Moriuchi et al. | |
| 5,661,061 A | 8/1997 | Usuami et al. | |
| 5,821,513 A | 10/1998 | O'Hagan et al. | |
| 5,858,829 A | 1/1999 | Chen | |
| 5,925,918 A | 7/1999 | Wu et al. | |
| 5,949,057 A | 9/1999 | Feng | |
| 5,977,579 A | 11/1999 | Noble | |
| 6,008,513 A | 12/1999 | Chen | |
| 6,043,562 A | 3/2000 | Keeth | |
| 6,081,008 A | 6/2000 | Rostoker | |
| 6,100,129 A | 8/2000 | Tu et al. | |
| 6,130,144 A | 10/2000 | Verret | |
| 6,130,551 A | 10/2000 | Agrawal et al. | |
| 6,216,257 B1 | 4/2001 | Agrawal et al. | |
| 6,252,284 B1* | 6/2001 | Muller et al. | ........... 257/412 |
| 6,258,656 B1 | 7/2001 | Lange et al. | |
| 6,258,659 B1 | 7/2001 | Gruening et al. | |
| 6,268,243 B1 | 7/2001 | Park | |
| 6,282,113 B1 | 8/2001 | DeBrosse | |
| 6,316,309 B1 | 11/2001 | Holmes et al. | |
| 6,380,759 B1 | 4/2002 | Agrawal et al. | |
| 6,413,802 B1 | 7/2002 | Hu et al. | |
| 6,432,769 B1 | 8/2002 | Fukuda et al. | |
| 6,440,792 B1 | 8/2002 | Shaio et al. | |
| 6,548,363 B1 | 4/2003 | Wu et al. | |
| 6,667,506 B1 | 12/2003 | Reedy et al. | |
| 6,680,226 B2 | 1/2004 | Efland et al. | |
| 6,689,660 B1 | 2/2004 | Noble et al. | |

(Continued)

FOREIGN PATENT DOCUMENTS

DE 19946719 4/2001

(Continued)

OTHER PUBLICATIONS

U.S. Appl. No. 12/052,317, filed Mar. 20, 2008, Werner Juengling.

(Continued)

*Primary Examiner* — Tucker Wright
(74) *Attorney, Agent, or Firm* — Fletcher Yoder

(57) ABSTRACT

Disclosed is a device having a transistor that includes a source, a drain, a channel region extending between the source and the drain, a gate disposed near the channel region, and a conductive member disposed opposite of the channel region from the gate. The conductive member may not overlap the source, the drain, or both the source and the drain.

8 Claims, 45 Drawing Sheets

U.S. PATENT DOCUMENTS

| | | |
|---|---|---|
| 6,690,056 B1 | 2/2004 | Reedy et al. |
| 6,845,033 B2 | 1/2005 | Kirihata et al. |
| 6,897,107 B2 | 5/2005 | Divakaruni et al. |
| 6,927,462 B2 | 8/2005 | Goodwin et al. |
| 6,967,147 B1 | 11/2005 | Tews et al. |
| 6,998,666 B2 | 2/2006 | Beintner et al. |
| 7,091,543 B2 | 8/2006 | Tzeng et al. |
| 7,098,105 B2 | 8/2006 | Juengling |
| 7,099,216 B2 | 8/2006 | Luk et al. |
| 7,132,333 B2 | 11/2006 | Schloesser et al. |
| 7,151,023 B1 | 12/2006 | Nayfeh et al. |
| 7,190,060 B1 | 3/2007 | Chiang |
| 7,195,995 B2 | 3/2007 | Mouli |
| 7,205,606 B2 | 4/2007 | Tran |
| 7,250,342 B2 | 7/2007 | Kim |
| 7,332,396 B2 | 2/2008 | Lin et al. |
| 7,345,937 B2 | 3/2008 | Yoon et al. |
| 2001/0003034 A1 | 6/2001 | Furukawa et al. |
| 2002/0155656 A1 | 10/2002 | Hayano et al. |
| 2003/0111686 A1* | 6/2003 | Nowak ........................... 257/328 |
| 2003/0168676 A1 | 9/2003 | Itabashi et al. |
| 2003/0198073 A1 | 10/2003 | Keeth |
| 2004/0027848 A1 | 2/2004 | Wald et al. |
| 2004/0043592 A1 | 3/2004 | Goodwin et al. |
| 2004/0062069 A1 | 4/2004 | Keeth |
| 2004/0125636 A1 | 7/2004 | Kurjanowicz et al. |
| 2004/0202027 A1 | 10/2004 | Kuzmenka et al. |
| 2005/0133852 A1 | 6/2005 | Shau |
| 2005/0151206 A1 | 7/2005 | Schwerin |
| 2005/0196918 A1 | 9/2005 | Schwerin |
| 2005/0239254 A1 | 10/2005 | Chi et al. |
| 2005/0245024 A1 | 11/2005 | von Schwerin |
| 2006/0006446 A1 | 1/2006 | Schwerin |
| 2006/0057814 A1 | 3/2006 | Weis |
| 2006/0073662 A1 | 4/2006 | Jang et al. |
| 2006/0076602 A1 | 4/2006 | Harter et al. |
| 2006/0131651 A1 | 6/2006 | Sato et al. |
| 2006/0244106 A1 | 11/2006 | Morikado |
| 2006/0246607 A1 | 11/2006 | Fazan et al. |
| 2006/0270151 A1 | 11/2006 | Lee |
| 2006/0273415 A1 | 12/2006 | Kim |
| 2006/0281250 A1 | 12/2006 | Schloesser |
| 2007/0010058 A1 | 1/2007 | Juengling |
| 2007/0023805 A1 | 2/2007 | Wells et al. |
| 2007/0052040 A1 | 3/2007 | Schwerin |
| 2007/0111455 A1 | 5/2007 | Kim et al. |
| 2007/0121414 A1 | 5/2007 | Butler |
| 2007/0134878 A1 | 6/2007 | Brask et al. |
| 2007/0145450 A1 | 6/2007 | Wang et al. |
| 2007/0166933 A1 | 7/2007 | Song et al. |
| 2007/0170522 A1 | 7/2007 | Lee et al. |
| 2007/0176221 A1 | 8/2007 | Nakamura |
| 2007/0176222 A1 | 8/2007 | Ikemasu et al. |
| 2007/0176253 A1 | 8/2007 | Wang et al. |
| 2007/0190736 A1 | 8/2007 | Liu et al. |
| 2007/0262375 A1 | 11/2007 | Juengling |
| 2007/0262377 A1* | 11/2007 | Asa ............................... 257/345 |
| 2007/0296014 A1* | 12/2007 | Nakajima ...................... 257/308 |
| 2008/0308880 A1* | 12/2008 | Inaba ............................ 257/401 |

FOREIGN PATENT DOCUMENTS

| | | |
|---|---|---|
| JP | 2006054431 | 2/2006 |
| KR | 930005234 | 6/1993 |
| KR | 20020018071 | 3/2002 |
| TW | 380316 | 1/2000 |
| TW | 388125 | 4/2000 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |

OTHER PUBLICATIONS

U.S. Appl. No. 12/052,537, filed Mar. 20, 2008, Werner Juengling.

U.S. Appl. No. 12/062,354, filed Apr. 3, 2008, Werner Juengling.

U.S. Appl. No. 12/130,825, filed May 30, 2008, Werner Juengling.

Betty Prince, Ph.D.; "Trends in Scaled and Nanotechnology Memories"; Memory Strategies International; Leander, Texas; 2005.

Branislav Curanovic; "Development of a Fully-Depleted Thin-Body FinFET Process"; Department of Microelectronic Engineering, College of Engineering; Rochester Institute of Technology; Rochester, New York; Nov. 2003.

Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.

Enrico Gili; "Fabrication of Vertical MOSFETs With Reduced Parasitics and Suppression of Short Channel Effects"; Department of Electronics and Computer Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.pdf+dram+fins+%22process+flow%22+%22vertical+access%22.

F. Fishburn, et al.; "A 78nm 6F2 DRAM Technology for Multigigabit Densities".

J. Sturm, et al.; "Increased Transconductance in Fully-Depleted Ultra-Thin Silicon-on-Insulator MOSFETs"; 6 pages.

J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique". IEEE International Solid-State Circuits Conference, ISSCC 2004 / Session 2 / Non-Volatile Memory / 2.2, 2004.

R. Katsumata, et al.; "Fin-Array-FET on bulk silicon for sub-100 nm Trench Capacitor DRAM"; 2003 Symposium on VLSI Technology Digest of Technical Papers; Jun. 2003, 2 pages.

T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.

Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090.

Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.

Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.

Endoh, T., Shinmei, K., Sakuraba, H., Masuoka, F.; New Three-Dimensional Memory Array Architecture for Future Ultrahigh-Density DRAM; Res. Inst. of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFETs Architecture Featuring Partially-Insulating Technique for DRAM Cell Application of 40nm Generation and Beyond; http://ieeexplore.ieee.org/xpl/freeabs_all.jsp?arnumber=4154360.

Lo, G. Q., Joshi, A. B., and Kwong, Dim-Lee; Hot-Carrier-Stress Effects on Gate-Induced Drain Leakage Current in N-Channel Mosfet's; Ieeexplore.ieee.org/iel1/55/2522/00075679.pdf?arnumber=75679.

Bournel et al.; "Device performance and optimization of decananometer long double gate MOSFET by Monte Carlo simulation" Solid State Electronics, Elsevier Science Publishers, Barking, GB LNKD DOI: 10.1016/J.SSE.2007.02.010, vol. 51, No. 4, Apr. 10, 2007, pp. 543-550, XP022025454 ISSN: 0038-1101 Section "4. Overlap and underlap" starting on p. 545 figures 1, 6, 7.

U.S. Appl. No. 12/033,768, filed Feb. 19, 2008, Werner Juengling.

U.S. Appl. No. 12/033,780, filed Feb. 19, 2008, Werner Juengling.
U.S. Appl. No. 12/033,799, filed Feb. 19, 2008, Werner Juengling.
U.S. Appl. No. 12/043,813, filed Mar. 6, 2008, Werner Juengling.
U.S. Appl. No. 12/052,300, filed Mar. 20, 2008, Werner Juengling.

\* cited by examiner

TRANSISTOR WITH A PASSIVE GATE

BACKGROUND

1. Field of Invention

Embodiments of the invention relate generally to electronic devices and, more specifically, in certain embodiments, to asymmetric fin transistors.

2. Description of Related Art

In many types of electronic devices, transistors are used to selectively conduct current. The transistors usually include a source, a drain, and a gate. The gate controls current flowing between the source and the drain. Transistors are often characterized by a threshold gate voltage, below which the transistor is considered to be in an off state, and above which the transistor is considered to be in an on state. Thus, to impede the flow of current when the transistor is off, the gate voltage of the transistor is held below the threshold voltage. However, some transistors function in the opposite manner-conducting current at a sub-threshold gate voltage and impeding current at a higher gate voltage.

When a transistor is in the off state, some current may still leak. Electric fields within the transistor may form conductive paths through which current escapes. Often when the transistor is off, the gate voltage is different from the drain voltage. This voltage difference may form a relatively strong electric field, as a portion of the gate is frequently disposed near part of the drain. The resulting electric field can cause charge carriers to flow between the drain and the substrate on which the transistor is formed, a phenomenon referred to as "gate-induced drain leakage" (GIDL).

DETAILED DESCRIPTION

Figure 1:
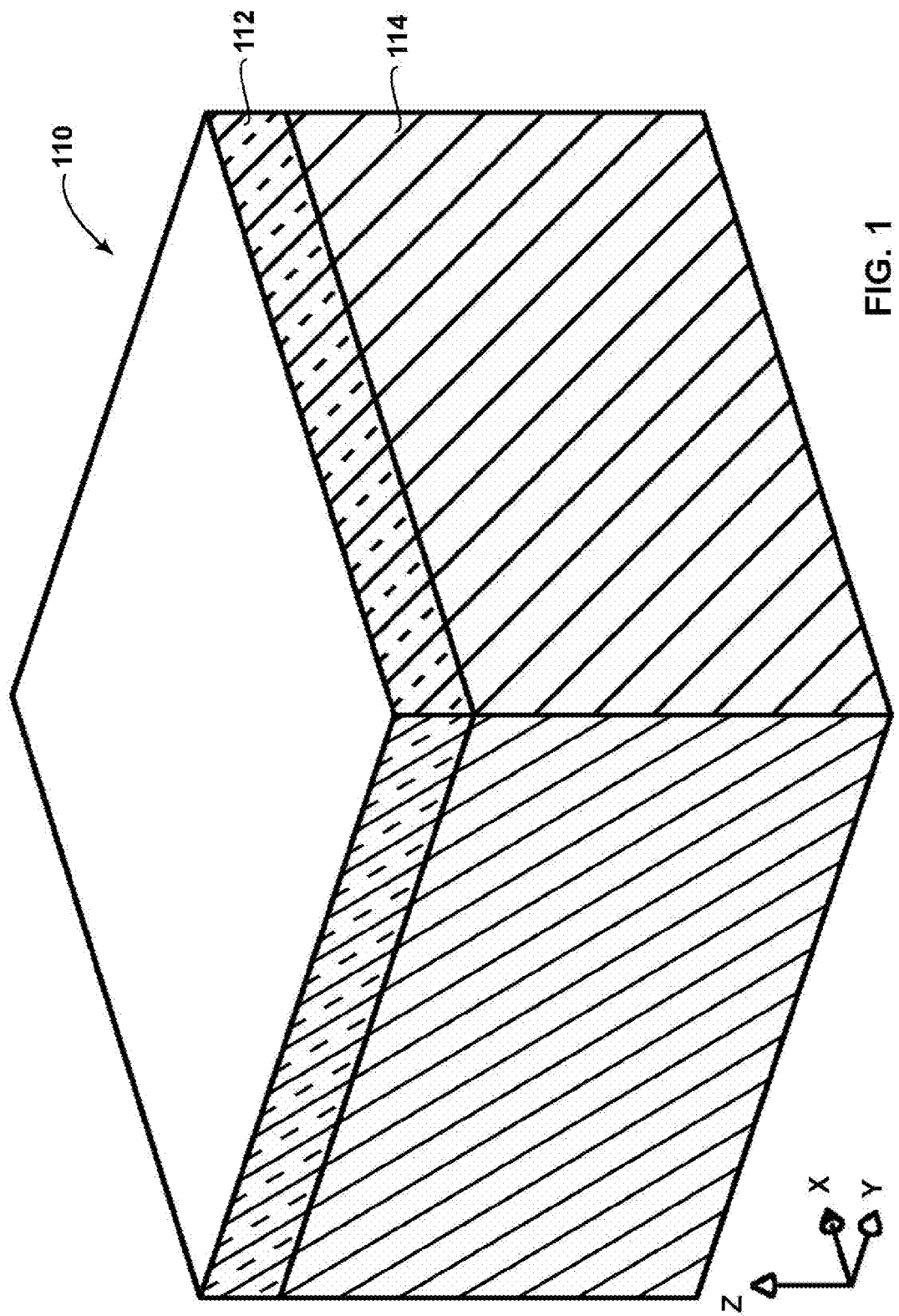
FIGS. 1-25 illustrate an example of a process for forming an array of transistors in accordance with an embodiment of the present technique.

FIG. 1 illustrates a first step in an embodiment of a process for forming an array of transistors. The process may begin with obtaining a substrate 110. The substrate 110 may include semiconductive materials such as single-crystal or poly-crystalline silicon, gallium arsenide, indium phosphide, or other materials with semiconductor properties. Alternately, or additionally, the substrate 110 may include a non-semiconductor body on which an electronic device may be constructed, e.g., a body such as a plastic or ceramic work surface. The term "substrate" encompasses these structures in a variety of stages of manufacture, including an unprocessed whole wafer, a partially-processed whole wafer, a fully-processed whole wafer, a portion of a diced wafer, or a portion of a diced wafer in a packaged electronic device.

The substrate 110 may include an upper doped region 112 and a lower doped region 114. The depth of the upper doped region 112 may be generally uniform over a substantial area of the substrate 110, and the upper doped region 112 may be doped differently from the lower doped region 114. For example, the upper-doped region 112 may include an n+ material and the lower-doped region 114 may include a p− material or vise versa.

Figure 2:
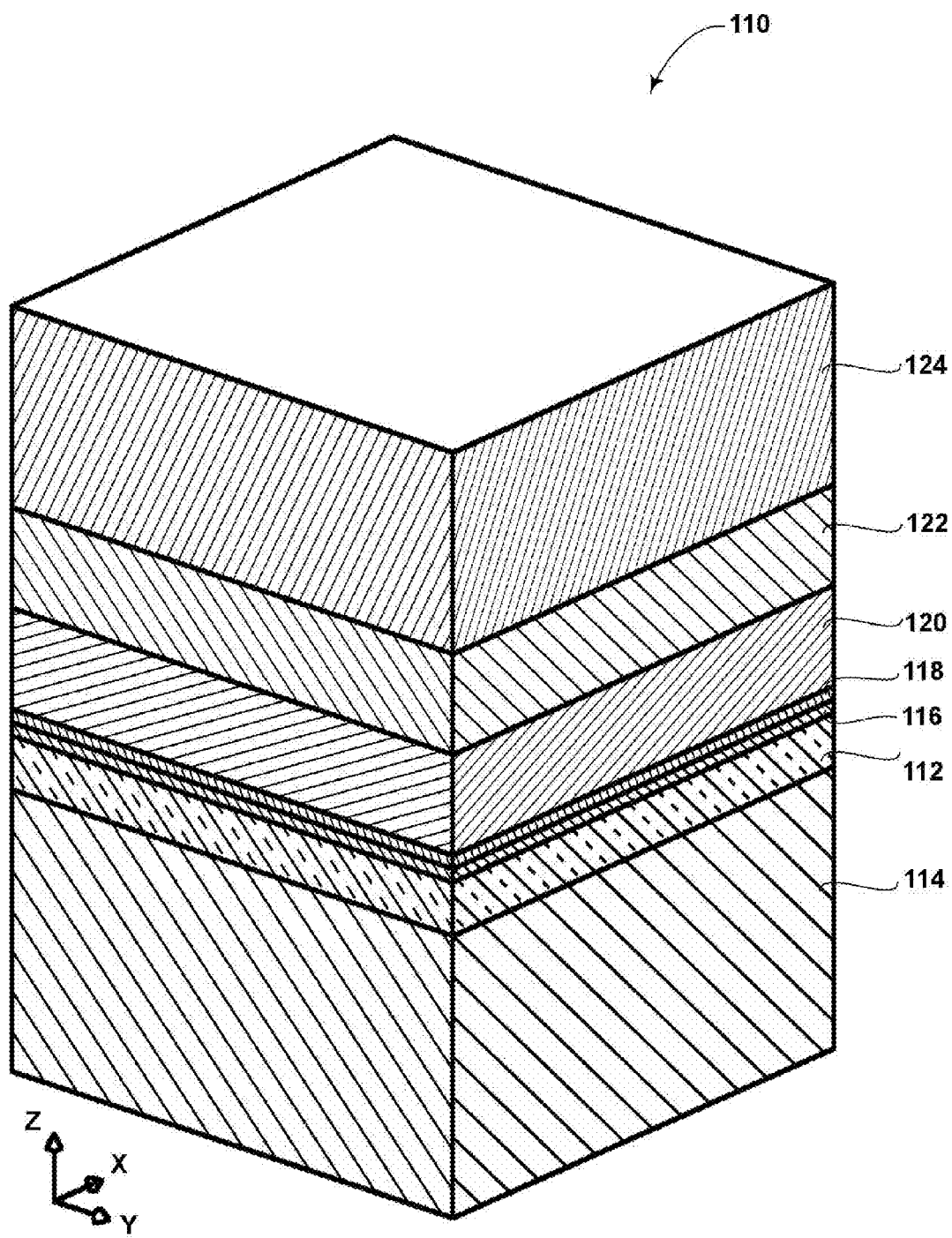

Next, several films may be formed on the substrate 110, as illustrated by FIG. 2. A pad oxide 116 may be formed on the upper doped region 112. The pad oxide 116 may have a thickness less than about 300 Å, e.g., less than or equal to about 80 Å may be useful. The pad oxide 116 may be formed with a variety of techniques. For instance, it may be grown by exposing the substrate 110 to oxygen, e.g., in a diffusion furnace, or it may be deposited with atomic-layer deposition (ALD), chemical-vapor deposition (CVD), or other processes. A stop body (e.g., a layer) 118 may be formed on the pad oxide 116 with, for example, CVD. The stop body 118 may include a nitride, such as silicon nitride, and it may have a thickness less than about 300 Å, e.g., about 95 Å may be useful, but like the other structures described herein, the stop body 118 is not limited to these dimensions or materials. A sacrificial body 120 may be formed on the stop body 118. The sacrificial body 120 may be made of polysilicon and it may have a thickness between about 500 Å and about 2,000 Å, e.g., about 1000 Å may be useful. The sacrificial body 120 may be formed with CVD or other appropriate processes. A lower masking body 122 may be formed on the sacrificial body 120. The lower masking body 122 may be made of an oxide and it may have a thickness between about 500 Å and about 2,000 Å, e.g., about 1000 Å may be useful. The lower masking body 122 may be formed with CVD, a spun-on-dielectric process, or other processes. Finally, an upper masking body 124 may be formed on the lower masking body 122. The upper masking body 124 may be made of carbon or other materials formed with CVD or other processes, and it may have a thickness between about 1000 Å and about 3000 Å, e.g., about 2000 Å may be useful.

Figure 3:
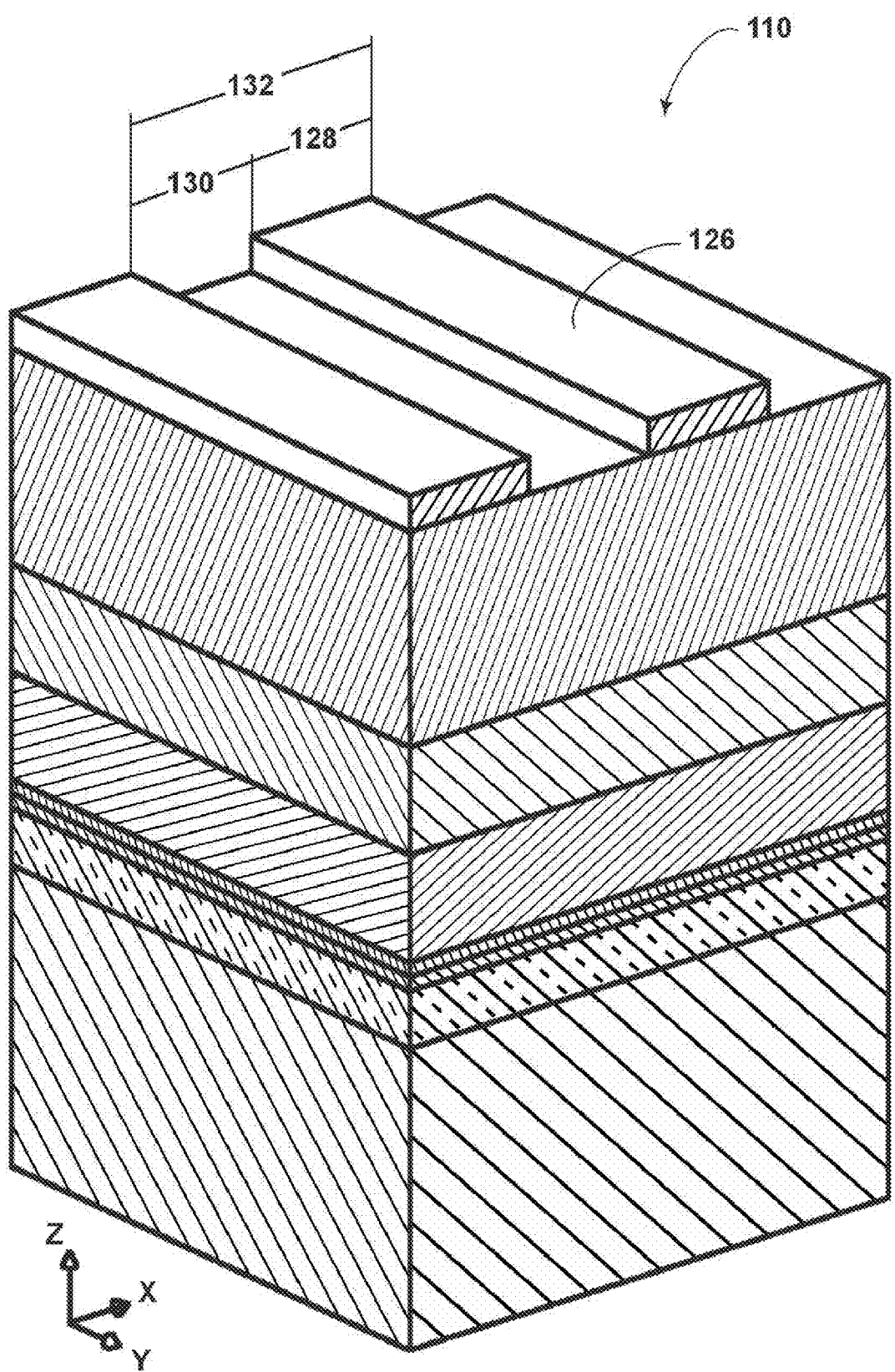

Next, a column mask 126 may be formed, as illustrated by FIG. 3. (The term "column" does not refer to any particular horizontal direction on the substrate 110 other than a direction that is different from the direction that subsequently-introduced rows extend.) The column mask 126 may include a pattern of lines that define masked regions having a width 128 and exposed regions having a width 130. The widths 128 and 130 may be generally equal to each other and each generally equal to the lithographic-resolution limit (e.g., the photolithographic-resolution limit, or minimum feature size), referred to as "F." The column mask 126 may have a pitch 132 (e.g., a distance over which a pattern repeats) that is generally equal to 2 F. The lines formed by the column mask 126 may be generally straight, generally parallel to each other, and may generally extend in the Y-direction. These lines may be generally continuous and generally uniform in the Y-direction. In other embodiments, the lines formed by the column mask 126 may have other shapes, e.g., they may undulate (e.g., up and down, left and right, or both), they may vary in width in the Y-direction, or they may be formed from a plurality of shorter segments.

Figure 4:
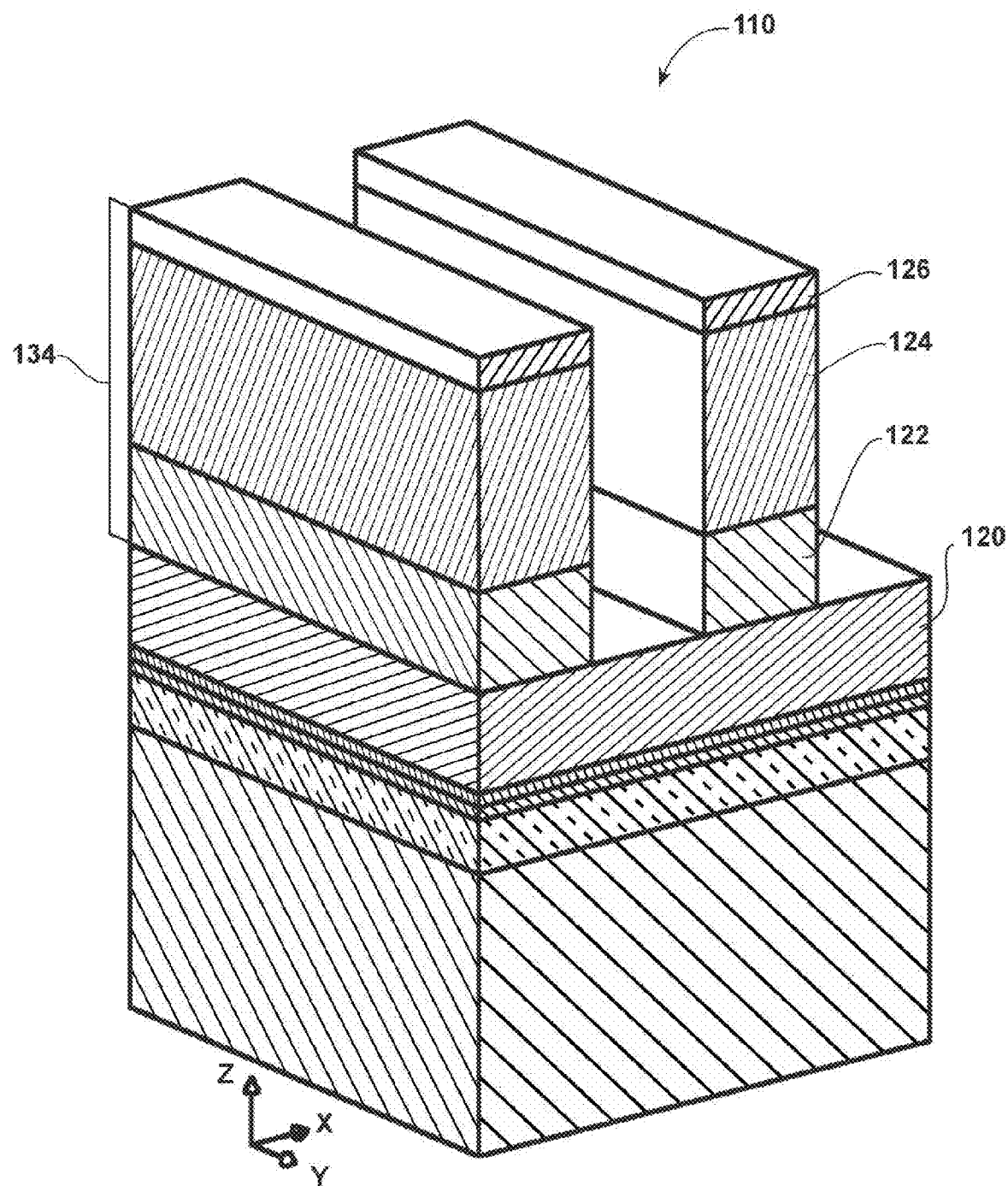

After forming the column mask 126, a column hard mask 134 may be formed, as illustrated by FIG. 4. The column hard mask 134 may be formed by generally-anisotropically etching (e.g., with a directional plasma etch) the portion of the upper masking body 124 and the portion of the lower masking body 122 that are disposed under the region not covered by the column mask 126. In some embodiments, the etch may stop on or in the sacrificial body 120.

Figure 5:
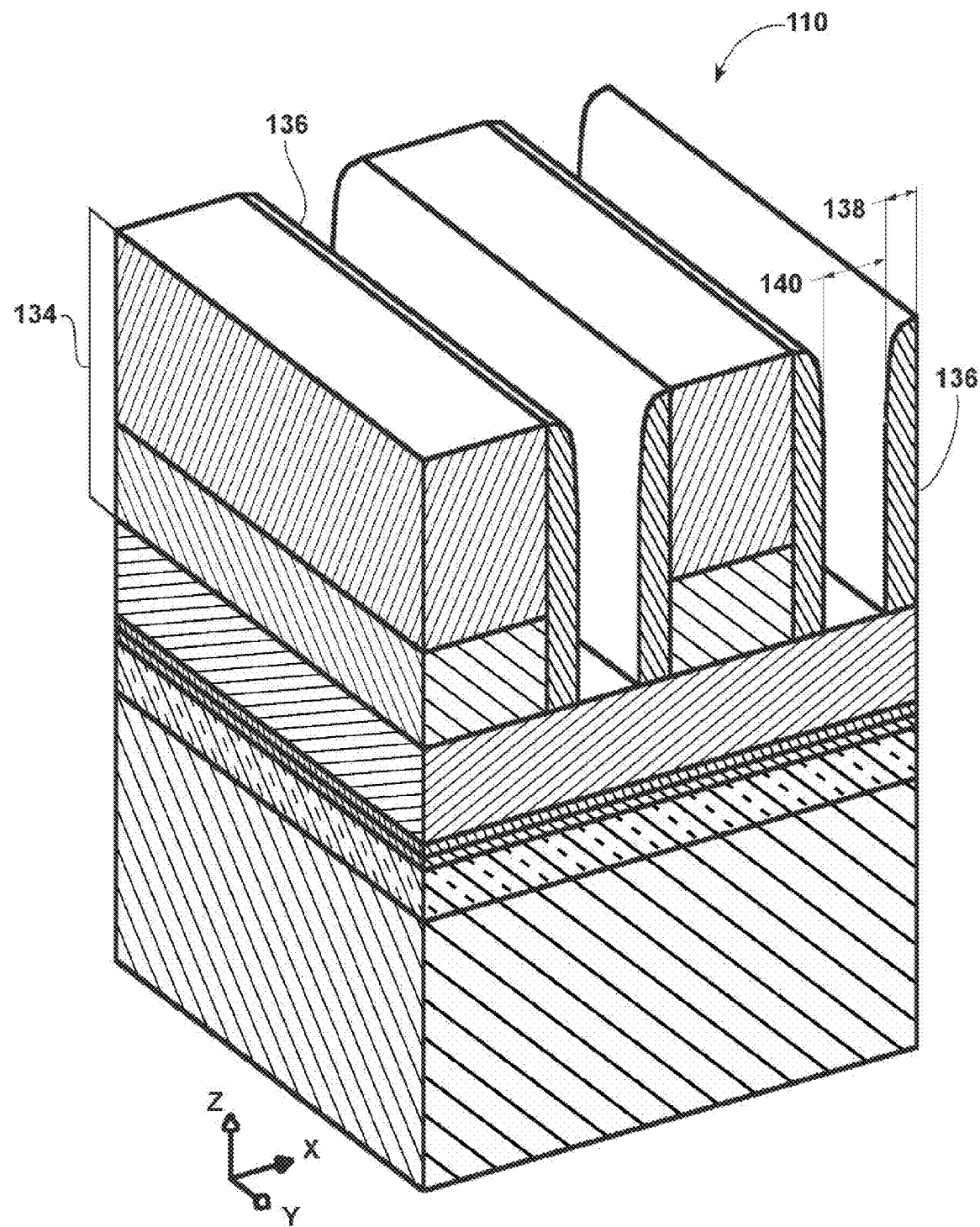

Next, the column mask 126 may be removed, and the column spacers 136 may be formed on the sidewalls of the column hard mask 134, as illustrated by FIG. 5. The column spacers 136 may be formed by depositing a generally conformal film (e.g., a film that is of generally uniform thickness on both vertical and horizontal structures) and, then, anisotropically etching that film to remove it from horizontal surfaces, leaving material disposed against generally vertical surfaces on the substrate 110. The column spacers 136 may be made of an oxide, and they may have a width 138 that is less than 100 nm, e.g., less than or equal to about 36 nm. The column spacers 136 may narrow the area exposed by the column hard mask 134 to a width 140 that is less than or equal to about F, e.g., equal to or less than about ¾ F, ½ F, or ¼ F.

Figure 6:
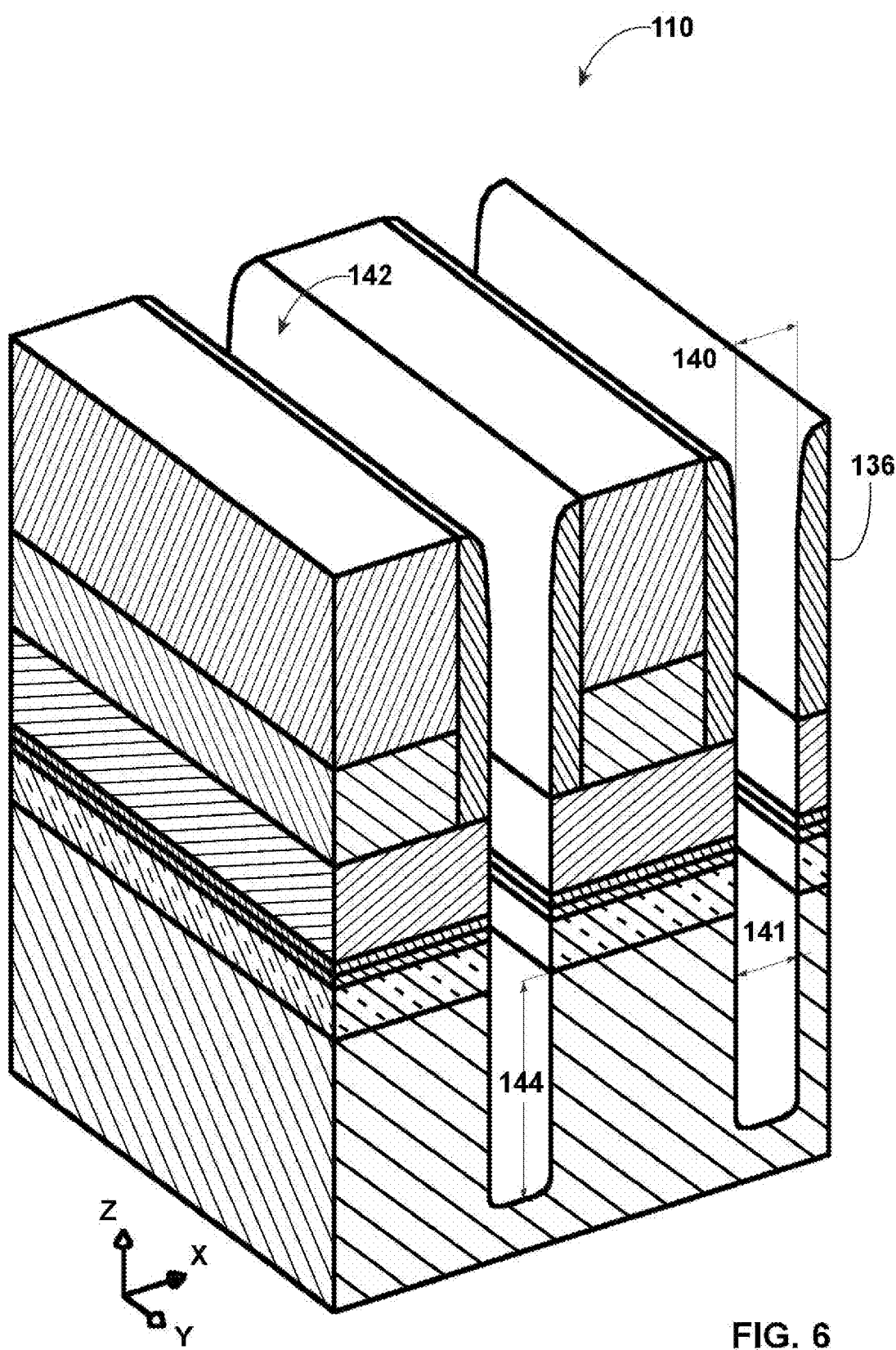

Next, as illustrated by FIG. 6, column isolation trenches 142 may be formed. The column isolation trenches 142 may be formed by anisotropically etching the exposed regions between the column spacers 136. The column isolation trenches 142 may have a width 141 that corresponds to (e.g., is generally equal to or is proportional to) the width 140. The column isolation trenches 142 may generally extend in the Y-direction and may be generally parallel to each other and generally straight. The cross-sectional shape of the column isolation trenches 142 may be generally uniform in the Y-direction. In some embodiments, the column isolation trenches 142 may have a depth 144 that is between about 500 Å and about 5000 Å, e.g., about 2500 Å.

Figure 7:
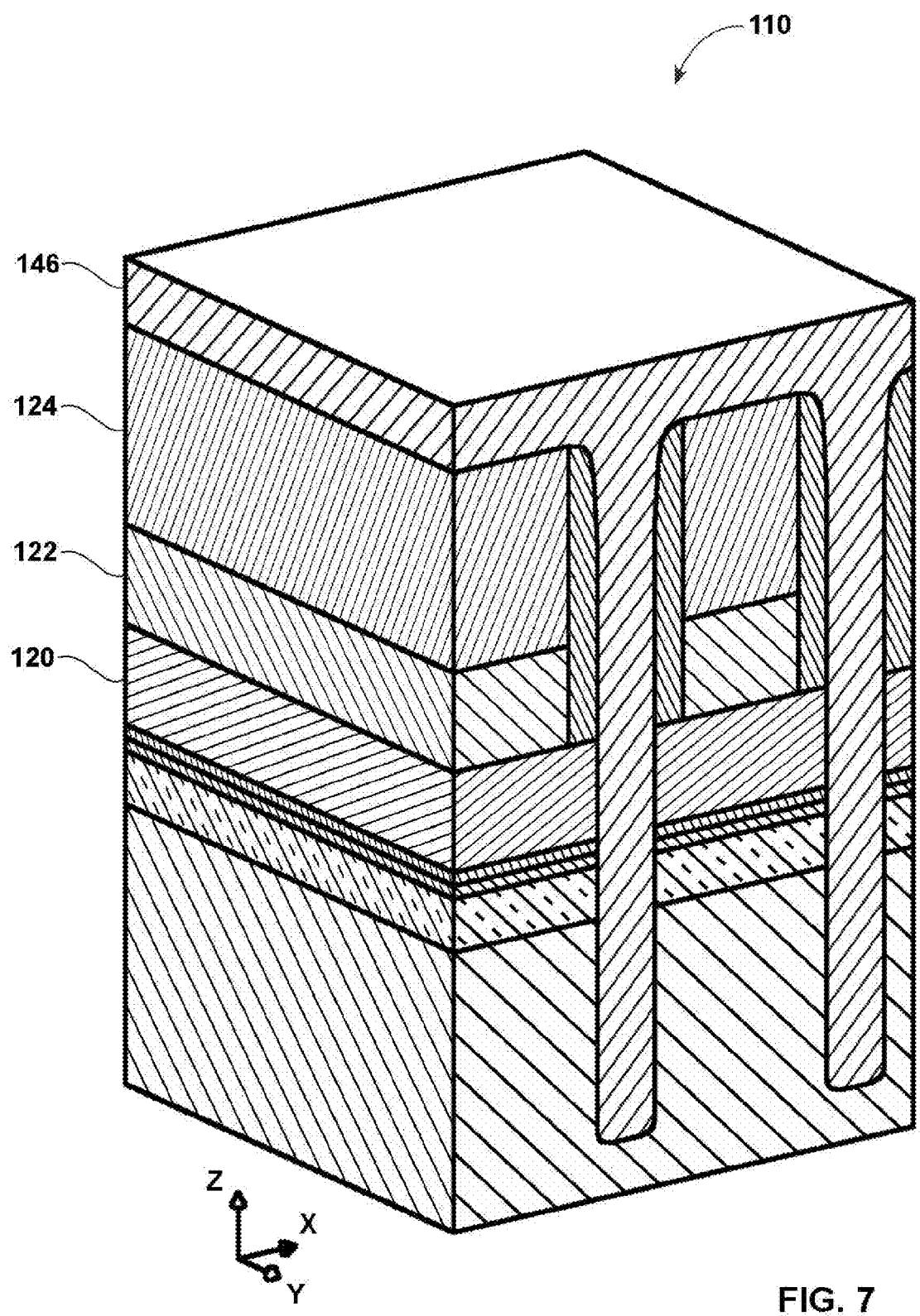

After forming the column isolation trenches 142, they may be filled partially or entirely with a dielectric 146, as illustrated by FIG. 7. The dielectric 146 may be made of a variety of materials, such as an oxide, and it may be lined with a variety of liner films (not shown), such as an oxide liner and a nitride liner. The liner may be included to enhance the characteristics or prevent undesirable interaction of the dielectric 146 with underlying materials during downstream processing. As will be appreciated, the liner may be disposed or grown by any conventional techniques. The dielectric 146 may be formed with a variety of processes, such as a high-density plasma CVD process. In some embodiments, prior to forming the dielectric 146, the bottom of the column isolation trenches 142 may be implanted or diffused with a dopant (not shown) selected to further electrically isolate structures on opposing sides of the column isolation trenches 142.

Figure 8:
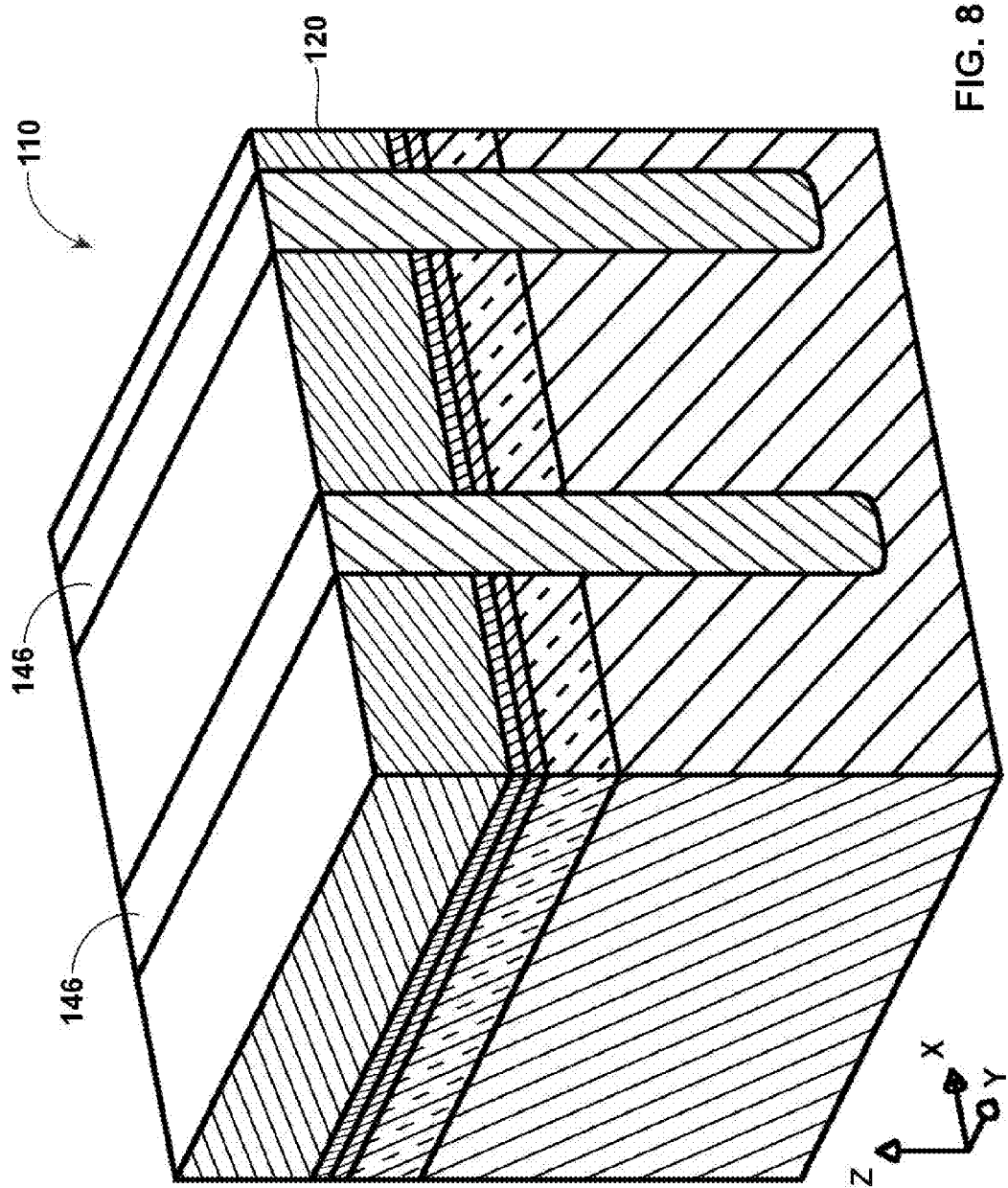

Next, the substrate 110 may be planarized, as illustrated by FIG. 8. Planarizing the substrate 110 may include etching the substrate 110 or polishing the substrate with chemical-mechanical planarization (CMP). Planarization may include removing both the upper masking body 124 and the lower masking body 122, and planarization may stop on or in the sacrificial body 120. Additionally, an upper portion of the dielectric 146 may be removed.

Figure 9:
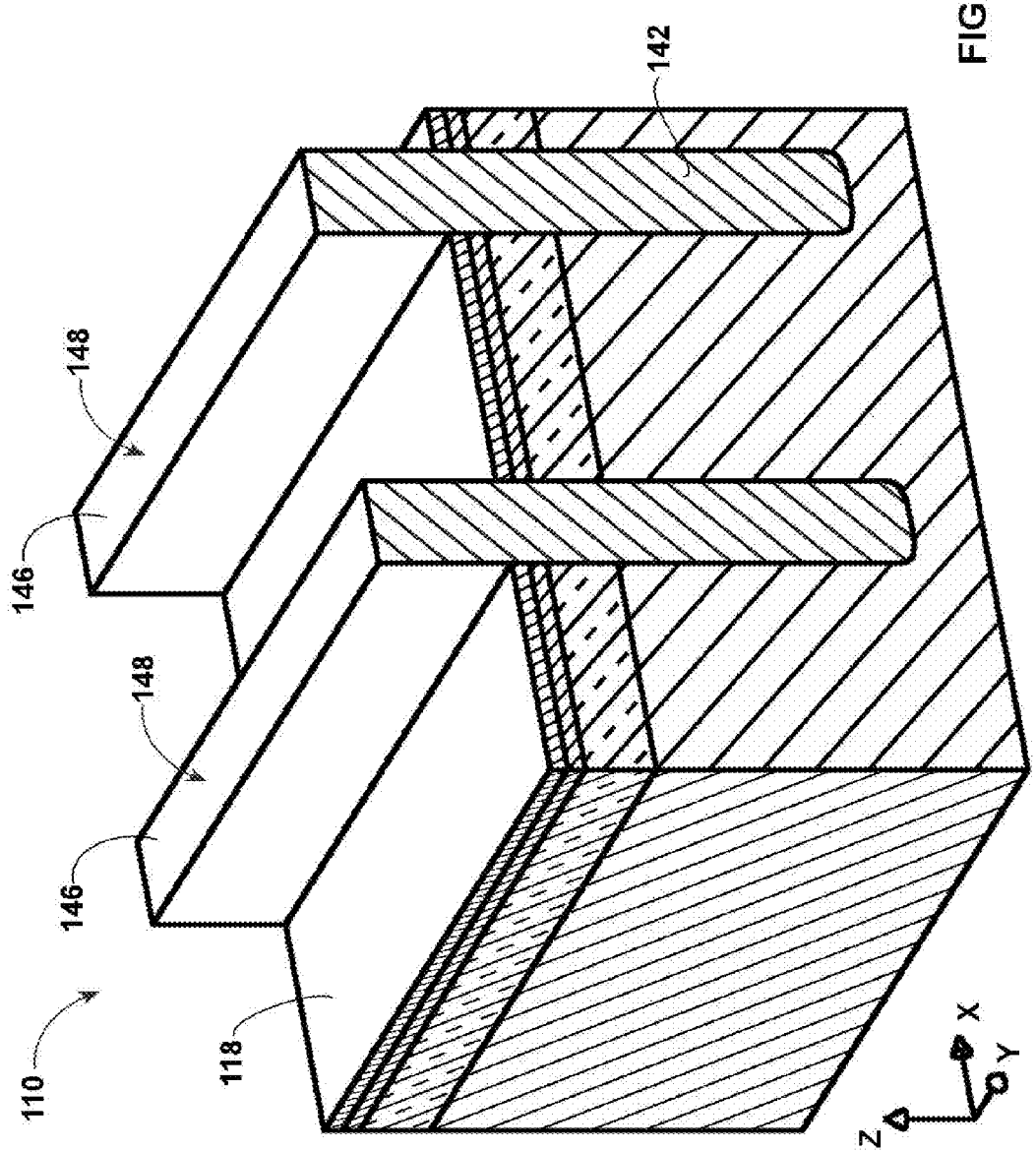

Next, the sacrificial body 120 may be partially or entirely removed, as illustrated by FIG. 9. Removing the sacrificial body 120 may include wet etching or dry etching the substrate 110 with an etch that selectively etches the sacrificial body 120 without removing a substantial portion of the exposed dielectric 146, i.e., with an etch that is selective to the sacrificial body 120. An etch is said to be "selective to" a material if the etch removes that material without removing a substantial amount of other types of material exposed on the substrate. After removing the sacrificial body 120, generally vertical projections 148 formed by the dielectric 146 may extend from the substrate 110.

Figure 10:
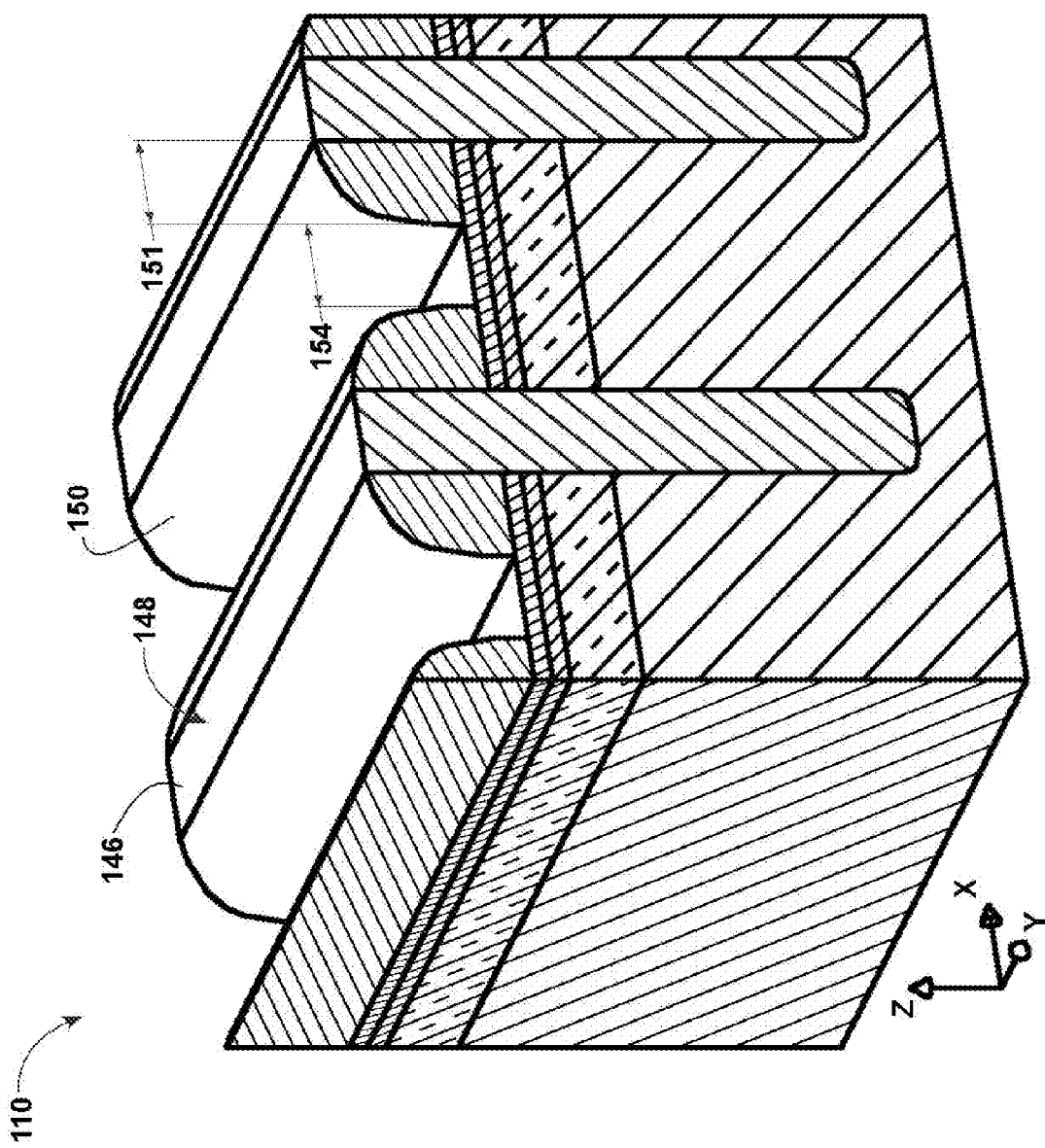

Next, a second column spacer 150 may be formed on the sidewalls of the generally vertical projections 148 of dielectric 146, as illustrated by FIG. 10. As with the previously-described column spacers 136, the second column spacers 150 may be formed by depositing a generally conformal film on the substrate 110 and anisotropically etching the film until the film is generally removed from the horizontal surfaces, leaving the material on the vertical surfaces on the substrate 110. The second column spacers 150 may be made of the same material as the dielectric 146, e.g., an oxide, or they may be made of a different material. The second column spacers 150 may have a width 151 that is less than or equal to about 100 nm, e.g., less than or equal to about 36 nm. The spacers 150 may define a width 154 between adjacent spacers 150 that is less than or equal to about 1 F, ¾ F, ½ F, or ¼ F.

Figure 11:
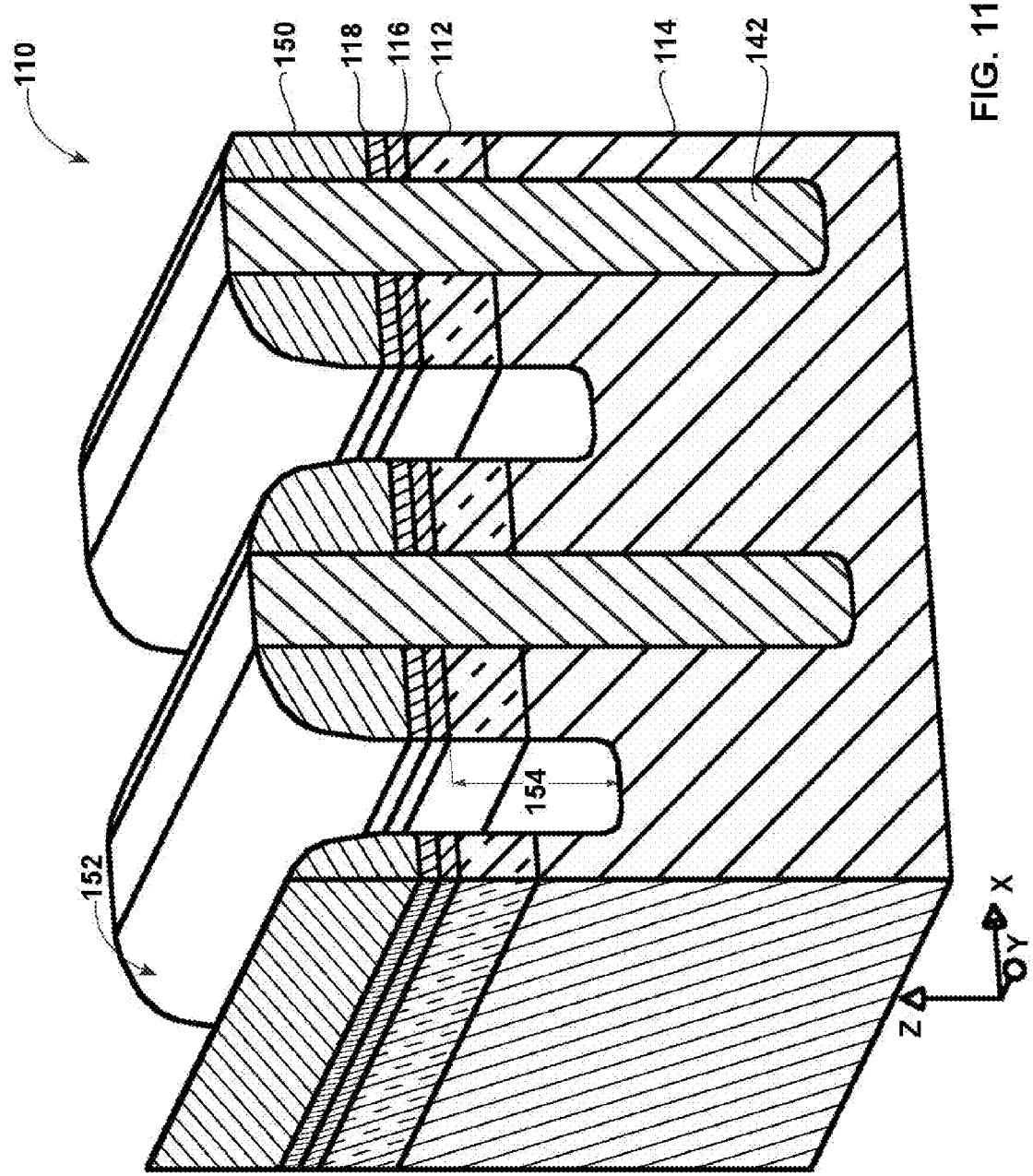

After forming the second group of column spacers 150, an intra-device trench 152 may be formed, as illustrated by FIG. 11. The intra-device trench 152 may be formed by anisotropically etching the exposed regions between the second column spacers 150. The intra-device trenches 152 may be substantially parallel to each other and the column isolation trenches 142, and they may generally extend in the Y-direction. The intra-device trenches 152 may have a depth 154 that is both less than the depth 144 (FIG. 6) of the column isolation trenches 142 and greater than the depth of the upper doped region 112.

Figure 12:
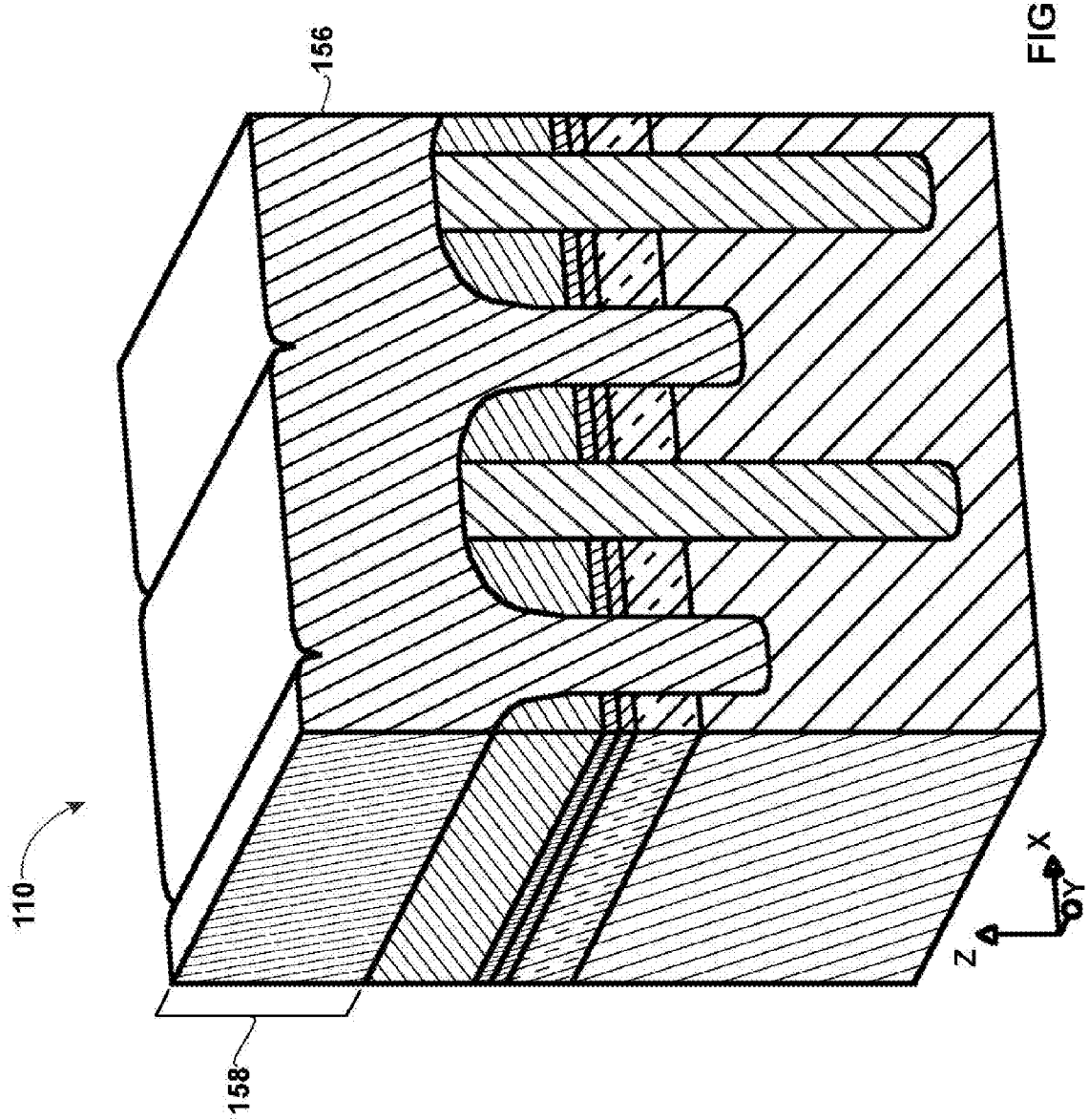

Next, a dielectric 156 may be formed, as illustrated by FIG. 12. The dielectric 156 may be formed with a thickness that produces an overburden 158, increasing the likelihood that the intra-device trenches 152 are filled. For example, the dielectric 156 may have a thickness less than about 800 Å, e.g., less than or equal to about 400 Å. The dielectric 156 may include or be formed primarily with tetra-ethyl-ortho silane (TEOS), e.g., with CVD TEOS, or other appropriate dielectric materials. The dielectric 156 may be densified after being formed by heating the substrate 110 to drive volatile compounds from the dielectric 156.

Figure 13:
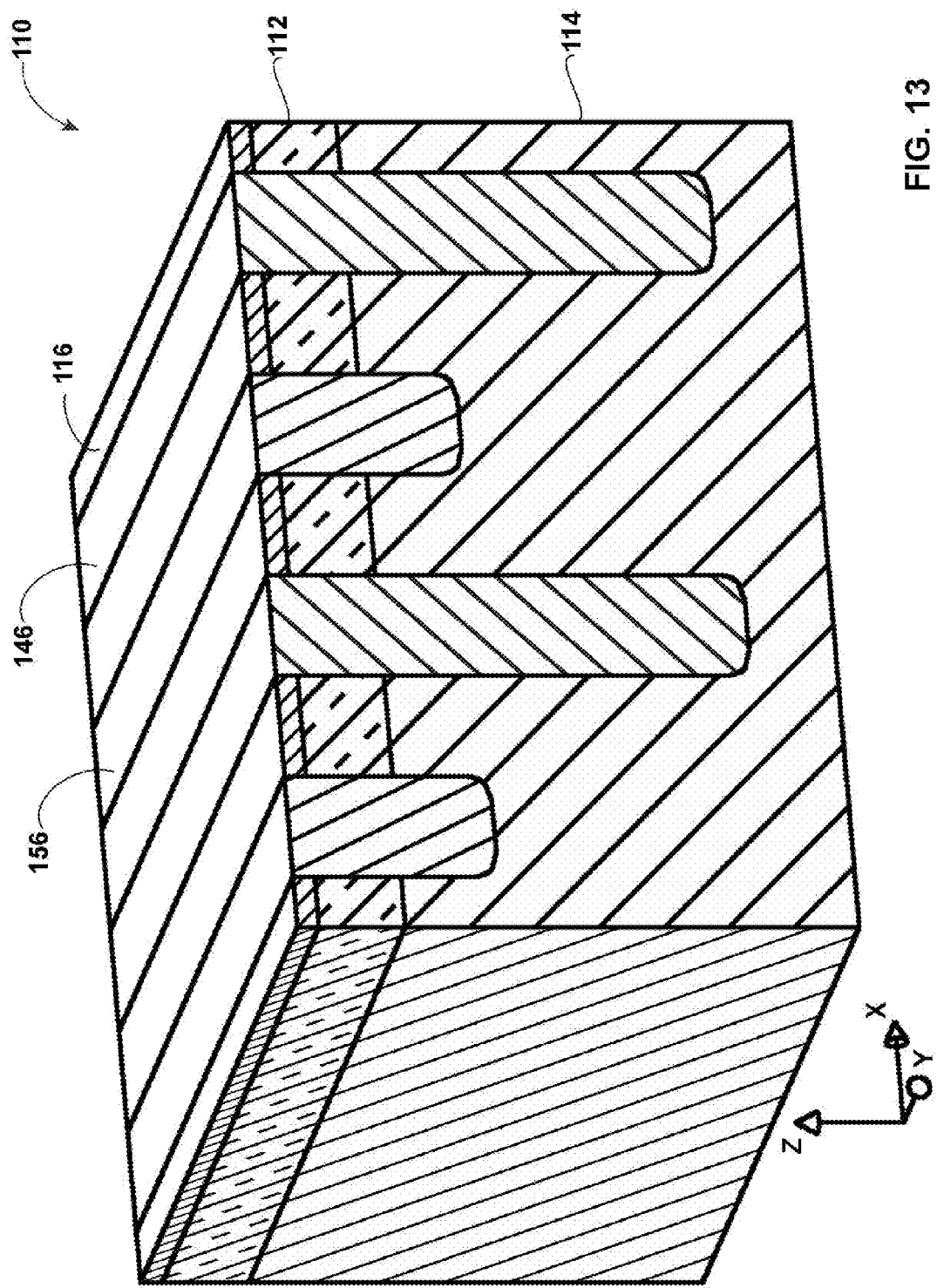

After forming the dielectric 156, the substrate 110 may be planarized, as illustrated by FIG. 13. The substrate 110 may be planarized with CMP, an etch-back process (e.g., by depositing a sacrificial planarizing material and then etching through the sacrificial planarizing material and into underlying structures), or other appropriate processes. The stop body 118 (FIG. 2) may function as a planarization stop, impeding removal of material from the upper doped region 112 and the pad oxide 116. After planarization, the material from the stop body 118 remaining on the substrate 110 may be removed, e.g., with a wet etch that stops in the pad oxide 116 or the upper doped region 112.

Figure 14:
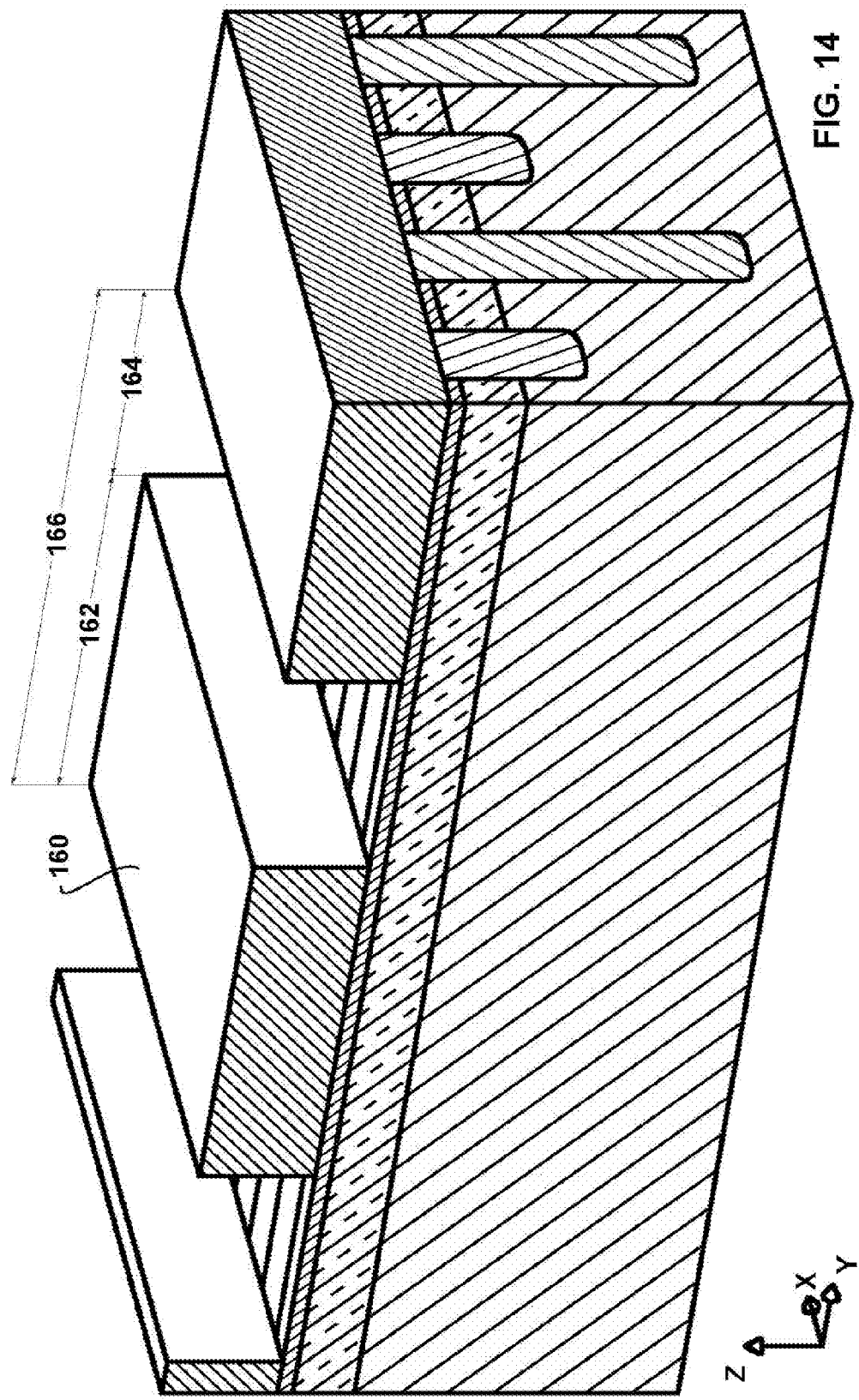

Next, a row mask 160 may be formed, as illustrated by FIG. 14. The row mask 160 may be substantially perpendicular to the column mask 126 (FIG. 4). The row mask 160 may be formed with photoresist or it may be a hard mask, for example, and it may be patterned with photolithography or other lithographic processes, e.g., nano-imprint lithography or electron-beam lithography. For example, the row mask 160 may be formed by patterning a body of amorphous carbon that is formed on the substrate 110. The amorphous carbon may be formed with a thickness less than about 3000 Å, e.g., a thickness less than or equal to about 2000 Å. The row mask 160 may define masked regions having a width 162 and exposed regions having a width 164. The masked width 162 may be larger than the exposed width 164, for example, more than about F, ¾ F, or ½ F larger. In some embodiments, the row mask 160 may be formed with a sub-photolithographic process, e.g., a sidewall-spacer process, a resist-reflow process, a wet-etch undercut process, or other line-width thinning process. The row mask 160 may define a pattern of lines with a pitch 166. In other embodiments, the pattern may be interrupted by other structures. The lines formed by the row mask 160 may be substantially straight, substantially parallel to one another, and may extend horizontally in approximately the X-direction and vertically in approximately the Z-direction. In other embodiments, the masked regions of the row mask 160 may vary in width, undulate side to side or up and down, or they may be segmented.

Figure 15:
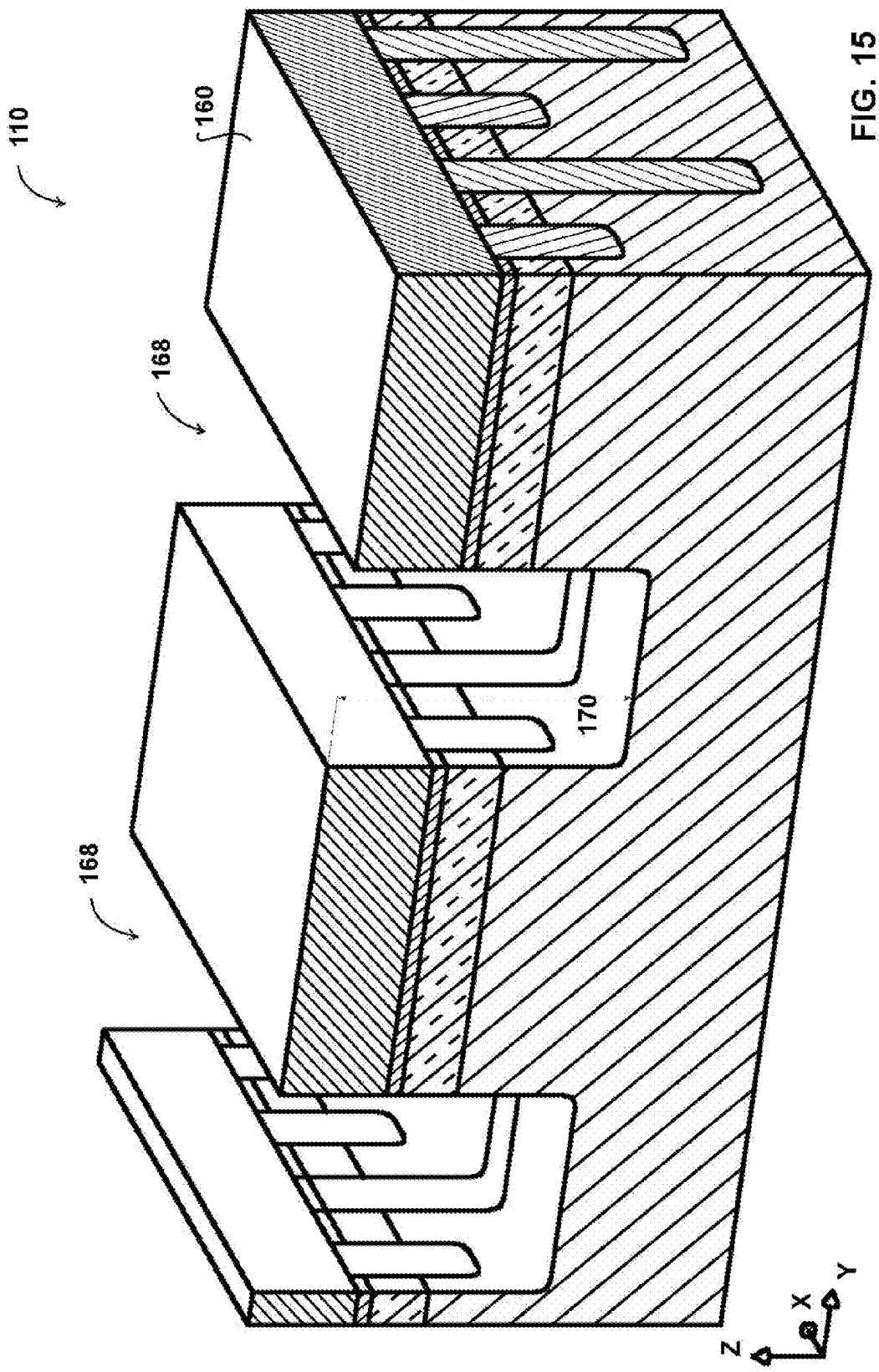
Figure 17:
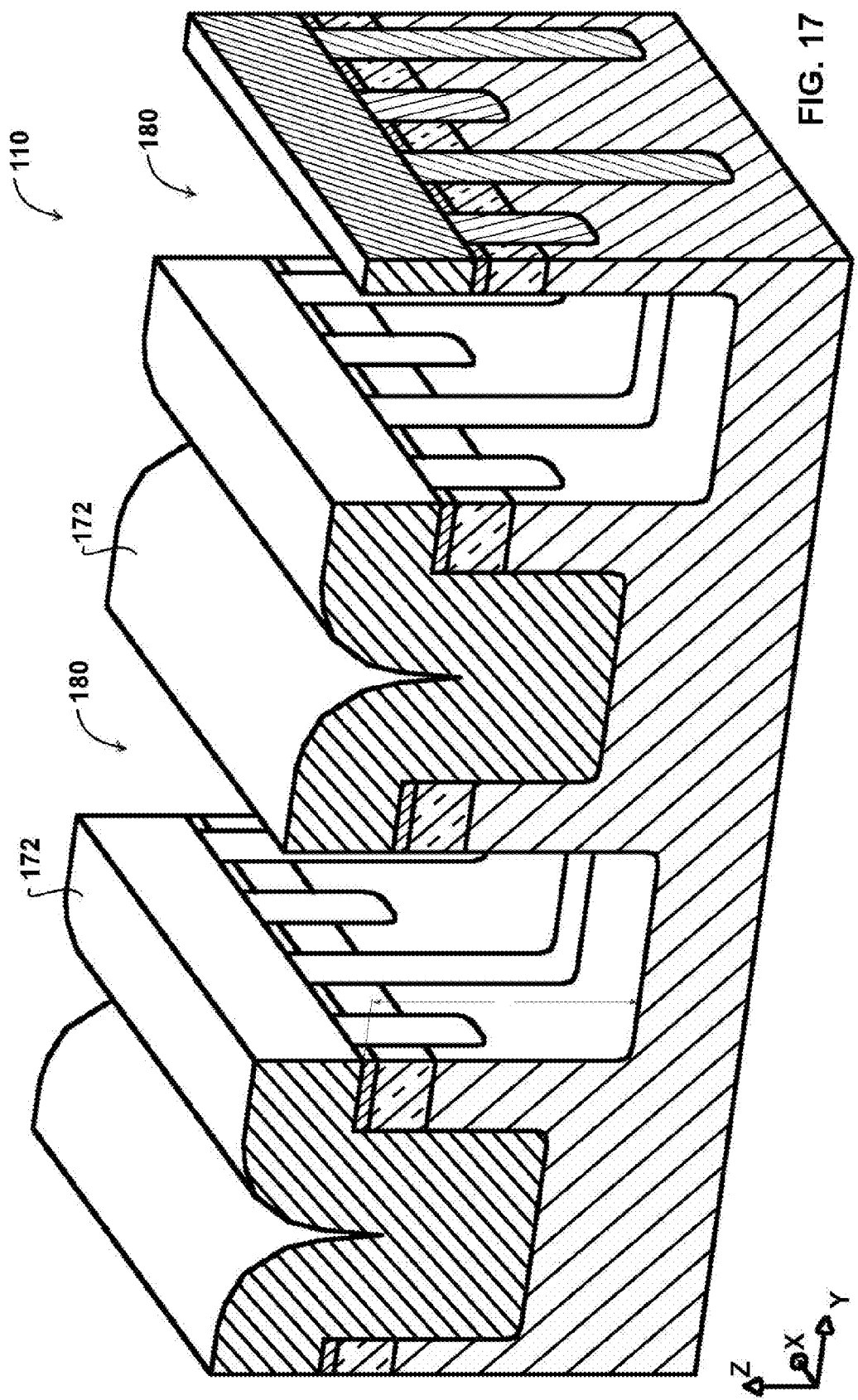

Next, shallow row trenches 168 may be formed, as illustrated by FIG. 15. The shallow row trenches 168 are shallow relative to subsequently described deep row trenches (FIG. 17). The shallow row trenches 168 may be formed with a dry etch that etches the upper doped region 112, the lower doped region 114, the dielectric 146, and the dielectric 156 at approximately the same rate. The shallow row trenches 168 may have a depth 170 that is greater than the depth of the intra-device trenches 152 (FIG. 11) and less than the depth of the column isolation trenches 142 (FIG. 11). For instance, the depth 170 may be less than about 3000 Å, e.g., equal to or less than about 1400 Å.

Figure 16:
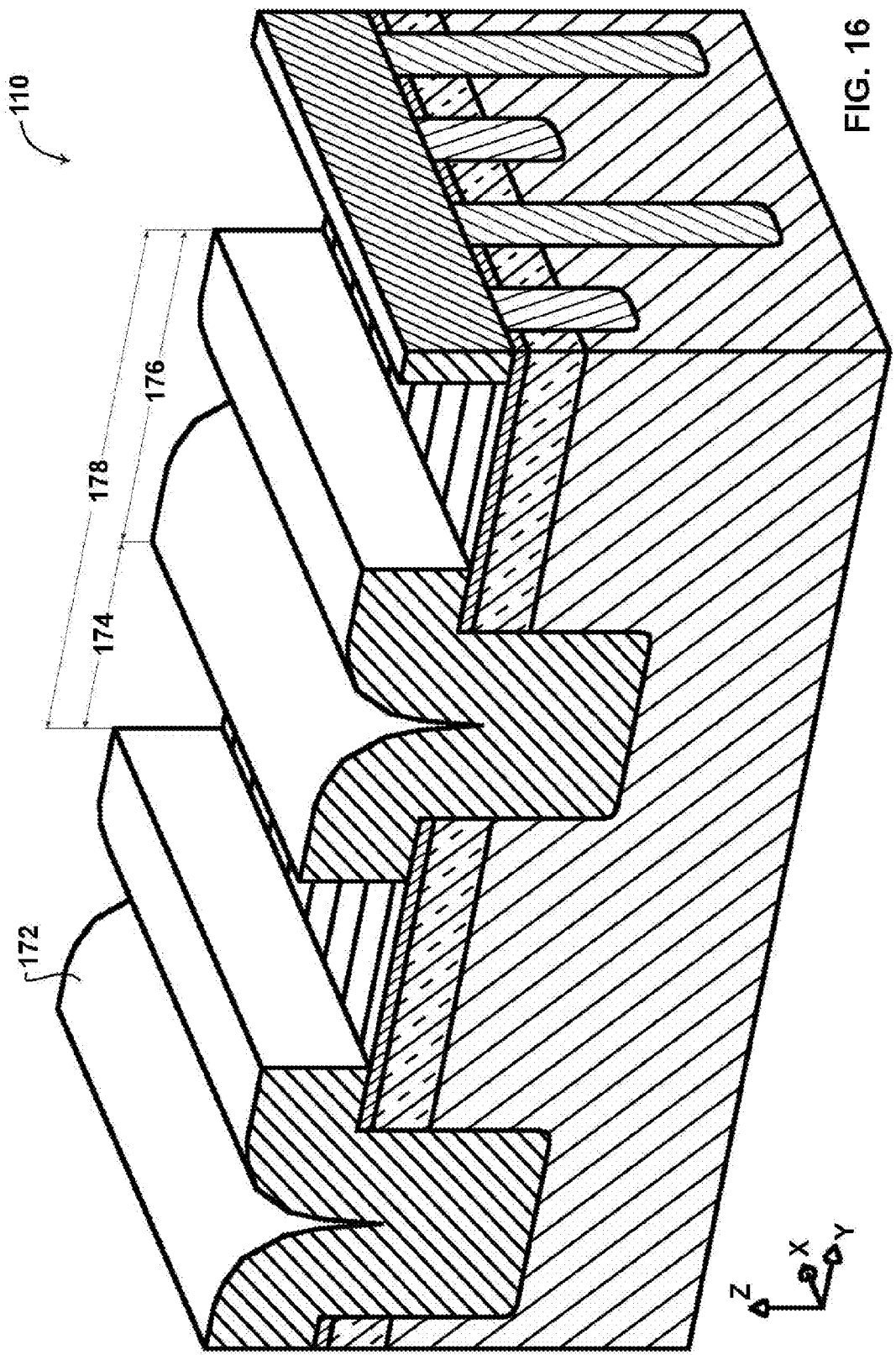

After forming the shallow row trenches 168, another row mask 172 may be formed, as illustrated by FIG. 16. The row mask 172 may be a soft mask or a hard mask formed with photolithography or other lithographic techniques. The row mask 172 may define an exposed width 174 and a masked width 176. The widths 174 and 176 may be approximately equal to the widths 164 and 162 (FIG. 14), respectively. The row mask 172 may be disposed partially or substantially entirely over the shallow row trenches 168 (FIG. 15), extending into and overlapping the shallow row trenches 168 (FIG. 15). The row mask 172 may extend substantially parallel to the row mask 160 (FIG. 14) in the X-direction and may be of substantially uniform width. In other embodiments, the row mask 172 may undulate side-to-side, up and down, vary in width, or be segmented. The row mask 172 may form a pattern that repeats with a pitch 178, or the pattern may be interrupted with other structures.

Next, deep row trenches 180 may be formed, as illustrated by FIG. 17. The deep row trenches 180 may be formed with a dry etch that etches the upper doped region 112, the lower doped region 114, the dielectric 146, and the dielectric 156 at generally the same rate. The deep row trenches 180 may have a depth 182 that is greater than the depth of the intra-device trenches 152 (FIG. 11), greater than the depth 170 of the shallow row trenches 168 (FIG. 15), and less than the depth of the column isolation trenches 142 (FIG. 11). For example, the depth 182 may be less than about 4000 Å, e.g., equal to or less than about 1800 Å.

Figure 18:
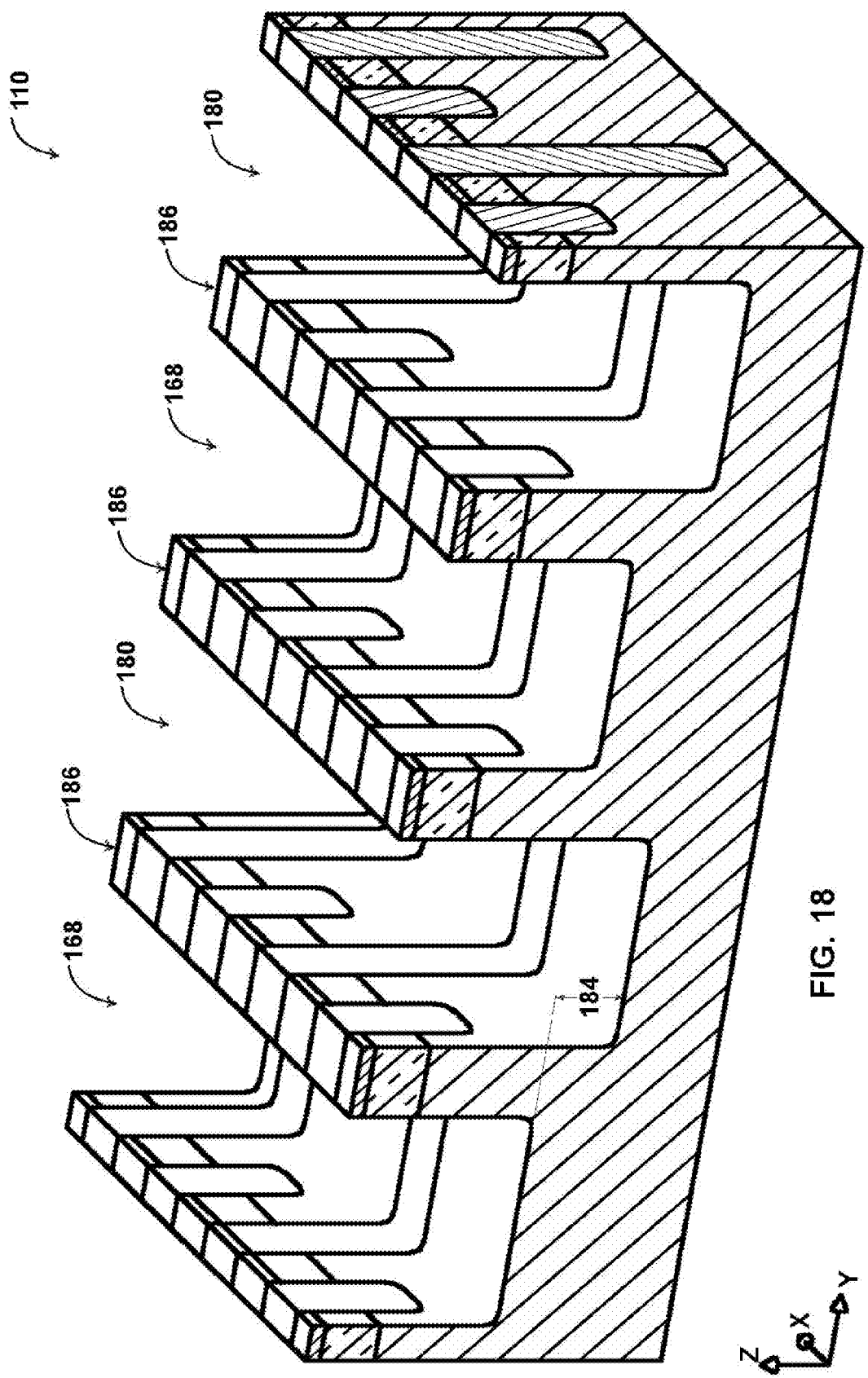

After forming the deep row trenches 180, the row mask 172 may be removed, leaving the structure illustrated by FIG. 18. The row mask 172 may be removed with combustion or other appropriate processes. The resulting substrate 110 may include one of the shallow row trenches 168 positioned between each pair of deep row trenches 180 in a pattern of alternating shallow row trenches 168 and deep row trenches 180. The deep row trenches 180 may be deeper than the shallow row trenches 168 by a depth 184 that is greater than or equal to about 100 Å, 400 Å, or 800 Å. The shallow row trenches 168 and the deep row trenches 180 may define fin rows 186 that rise substantially vertically from the substrate 110 in the Z-direction and extend substantially horizontally in the X-direction.

Figure 19:
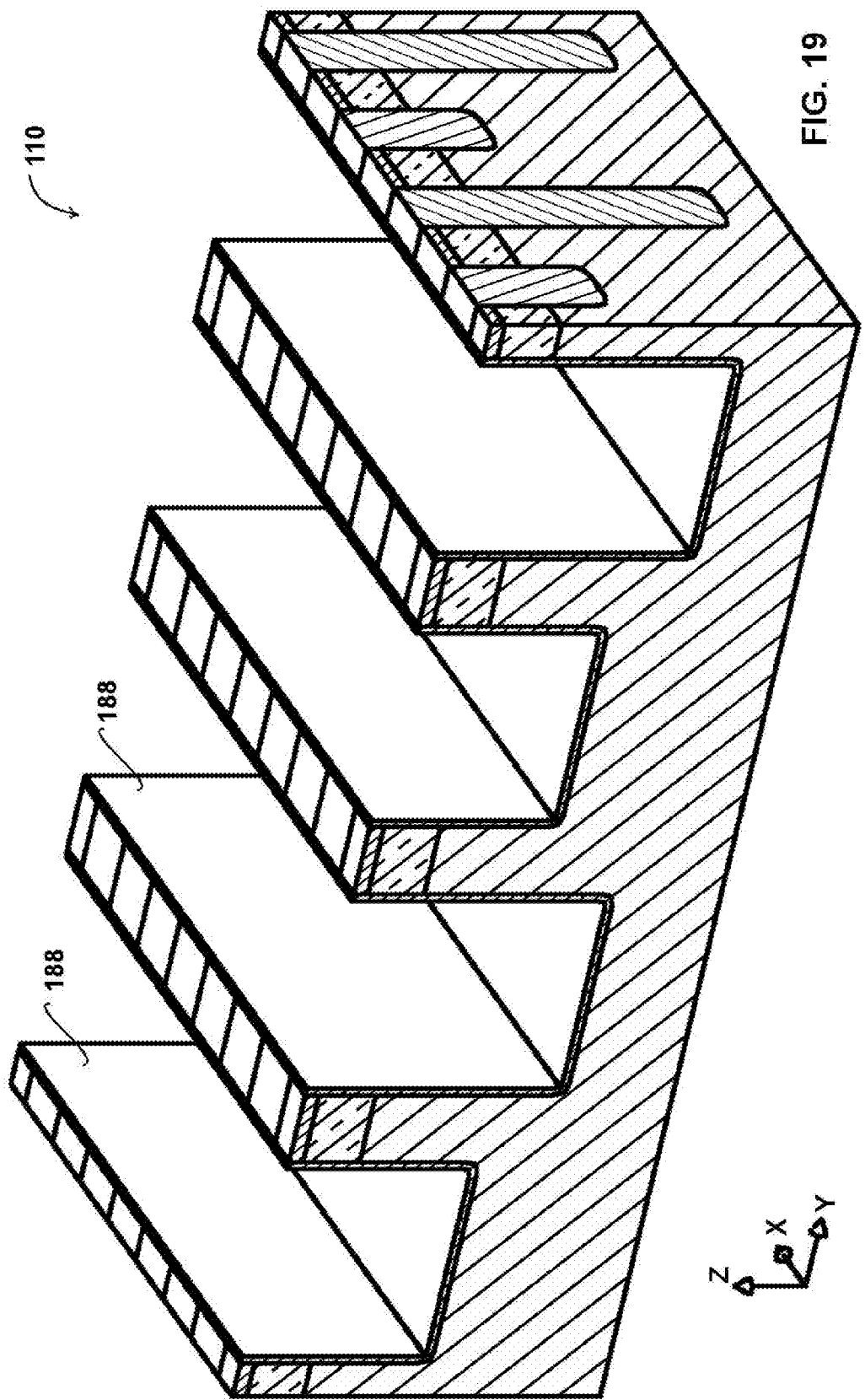

A gate dielectric 188 may be formed in the row trenches 168 and 180, as illustrated by FIG. 19. The gate dielectric 188 may be deposited, grown, or otherwise formed, and it may substantially or entirely cover the exposed portions of the upper doped region 112 and the lower doped region 114. The gate dielectric 188 may include a variety of dielectric materials, such as an oxide (e.g., silicon dioxide), oxynitride, or high-dielectric constant materials like hafnium dioxide, zirconium dioxide, and titanium dioxide. The gate dielectric 188 may have a thickness less than about 60 Å, e.g., a thickness equal to or less than about 40 Å.

Figure 20:
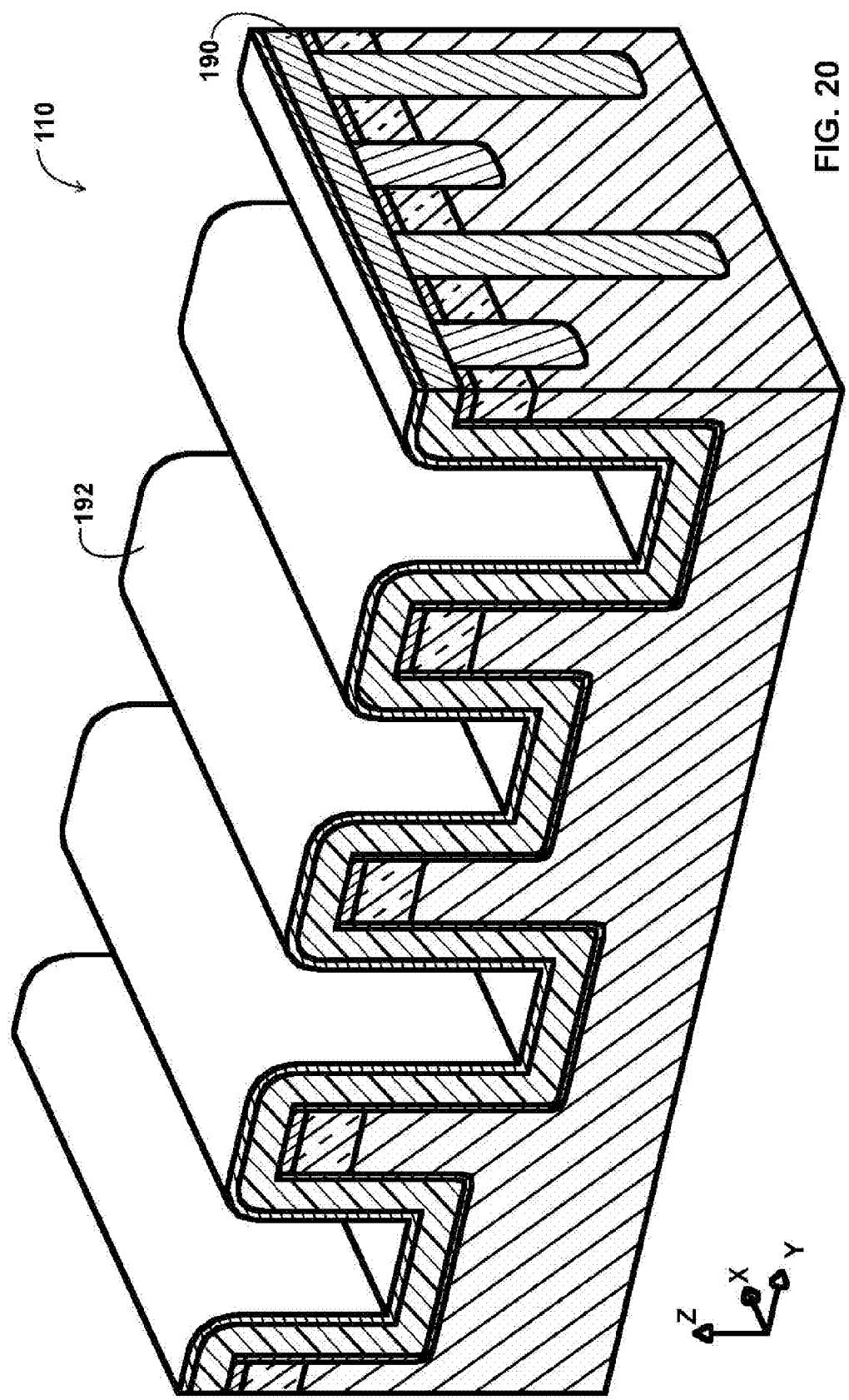

Next, a gate material 190 and a protective material 192 may be formed, as illustrated by FIG. 20. The gate material 190 may include a conductive material, such as doped polysilicon or one or more metals, e.g., Ti, TiN, or Ru. The protective material 192 may include a high-aspect-ratio-process (HARP) oxide formed on the gate material 190. The gate material 190 may be less than about 400 Å thick, e.g., less than or equal to about 250 Å thick, and the protective material 192 may be less than 200 Å thick, e.g., equal to or less than about 150 Å. These materials 190 and 192 may be generally conformally formed on the substrate 110.

Figure 21:
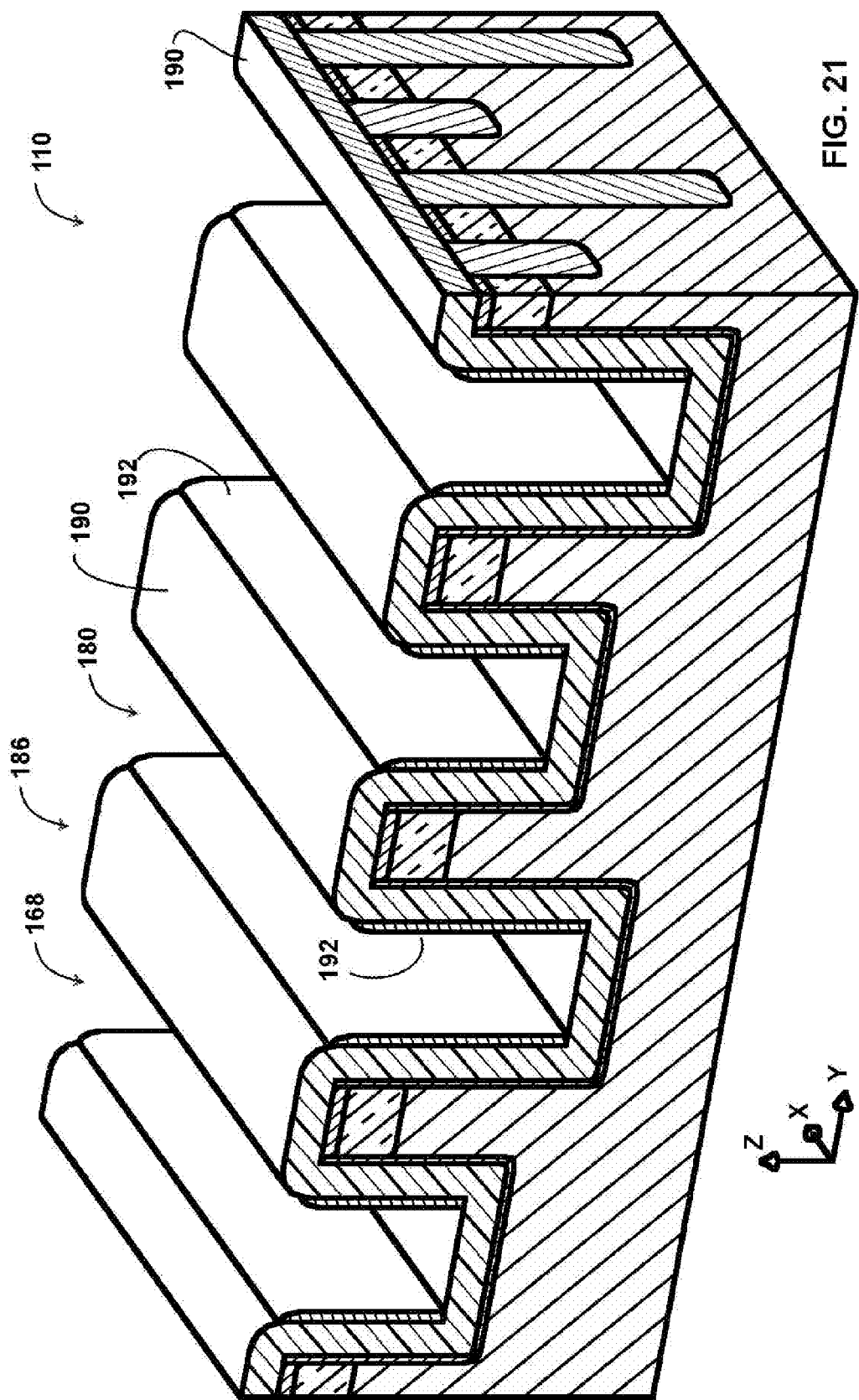

The protective material 192 may be anisotropically etched, as illustrated by FIG. 21, to form sidewall spacers. The protective material 192 may be etched with a dry etch that is generally selective to the protective material 192. After etching, the portion of the gate material 190 disposed on horizontal surfaces may be exposed. For instance, the gate material 190 disposed near both the top of the fin rows 186 and the bottom of the shallow row trenches 168 and the deep row trenches 180 may be exposed. In other embodiments, a portion or substantially all of the protective material 192 near the bottom of the deep row trenches 180 remains on the substrate 110.

Figure 22:
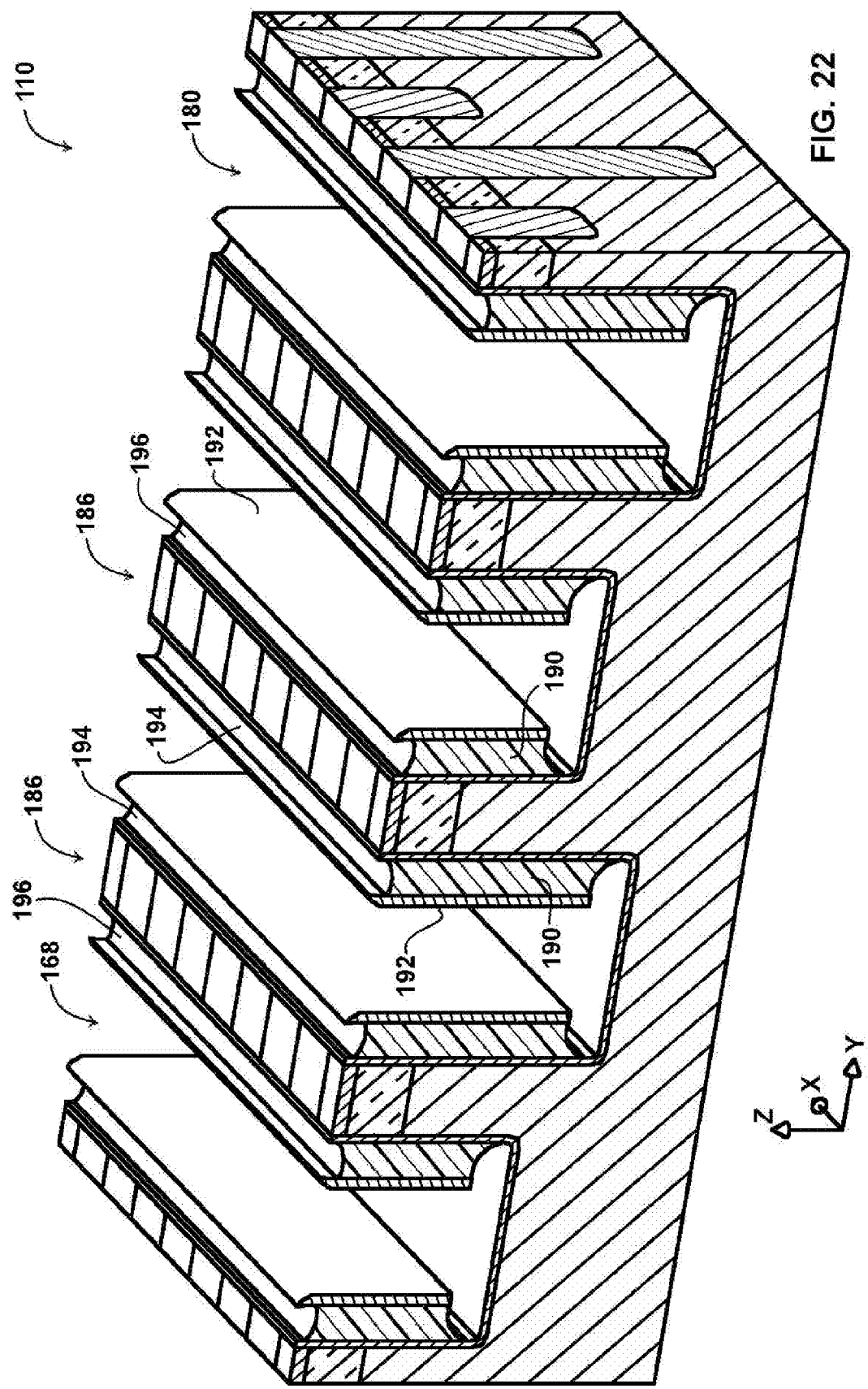

Next, the gate material 190 may be etched, as illustrated by FIG. 22. The exposed portions of the gate material 190 may be dry etched or wet etched, e.g., with an SC1 etch for less than about 10 minutes, e.g., equal to or less than about 5 minutes. The gate material 190 may be etched until the gate material 190 disposed on either side of the fin rows 186 is separated, leaving conductive sidewall spacers on the sides of the fin rows 186. The portion of the gate material 190 disposed near the bottom of the shallow row trenches 168 and the deep row trenches 180 may be removed, or it may be left on the substrate 110.

Etching the gate material 190 to form separate spacers may form a precursor to a passive gate 194 on one side of each fin row 186 and an active gate 196 on the other side of each fin row 186. The term "active" refers to structures relating to components that are selectively energized to turn on the transistor, and the term "passive" refers to structures relating to components that are energized at generally the same voltage both when the transistor is on and when the transistor is off. The precursor to passive gates 194 may be formed in the deep row trenches 180, and the active gates 196 may be formed in the shallow row trenches 168. Adjacent fin rows 186 and their associated gates 196 and 194 may be substantially reflectively symmetric about each deep row trench 180, such that the precursors to passive gates 194 are disposed on adjacent sides of the fin rows 186 and the active gates 196 are disposed on the far sides of the adjacent fin rows 186, or vise versa.

Figure 23:
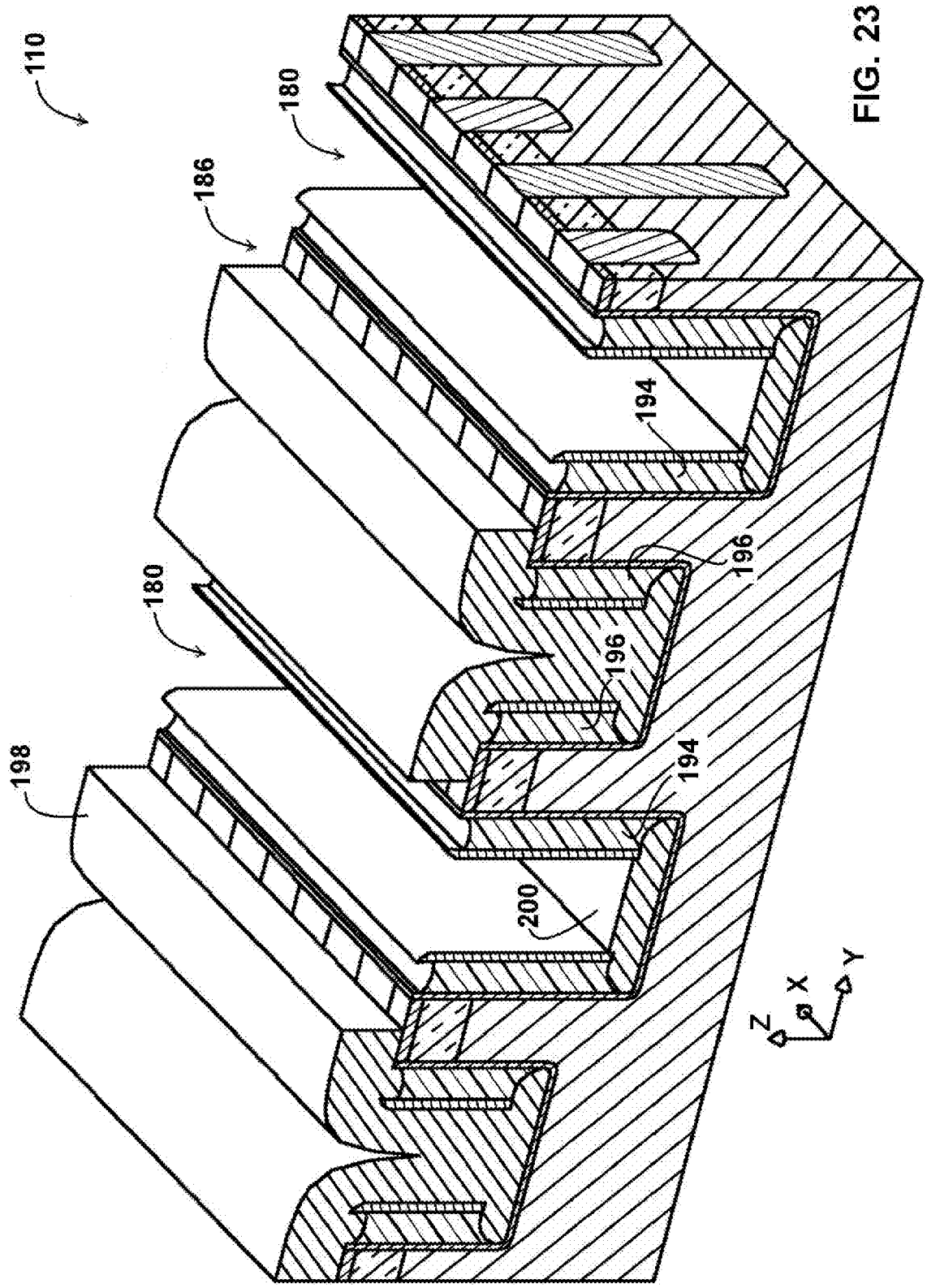

Next, a row mask 198 may be formed on the substrate 110, as illustrated by FIG. 23. The row mask 198 may be a soft mask or a hard mask patterned with photolithography or other lithographic techniques. The row mask 198 may be substantially aligned with and disposed in the shallow row trenches 168 (FIG. 22) and may overlap a portion of the top of the fin rows 186. The row mask 198 may also include a recessed portion 200 formed from undeveloped photoresist. For example, the row mask 198 may be formed with a positive photoresist, i.e., a resist that hardens when exposed to light, and the recessed portion 200 in the deep row trench 180 may not receive enough light to develop that portion of the row mask 198 because the light does not penetrate to the bottom of the deep row trenches 180. As a result, a portion of the photoresist may remain in the bottom of the deep row trenches 180.

Figure 24:
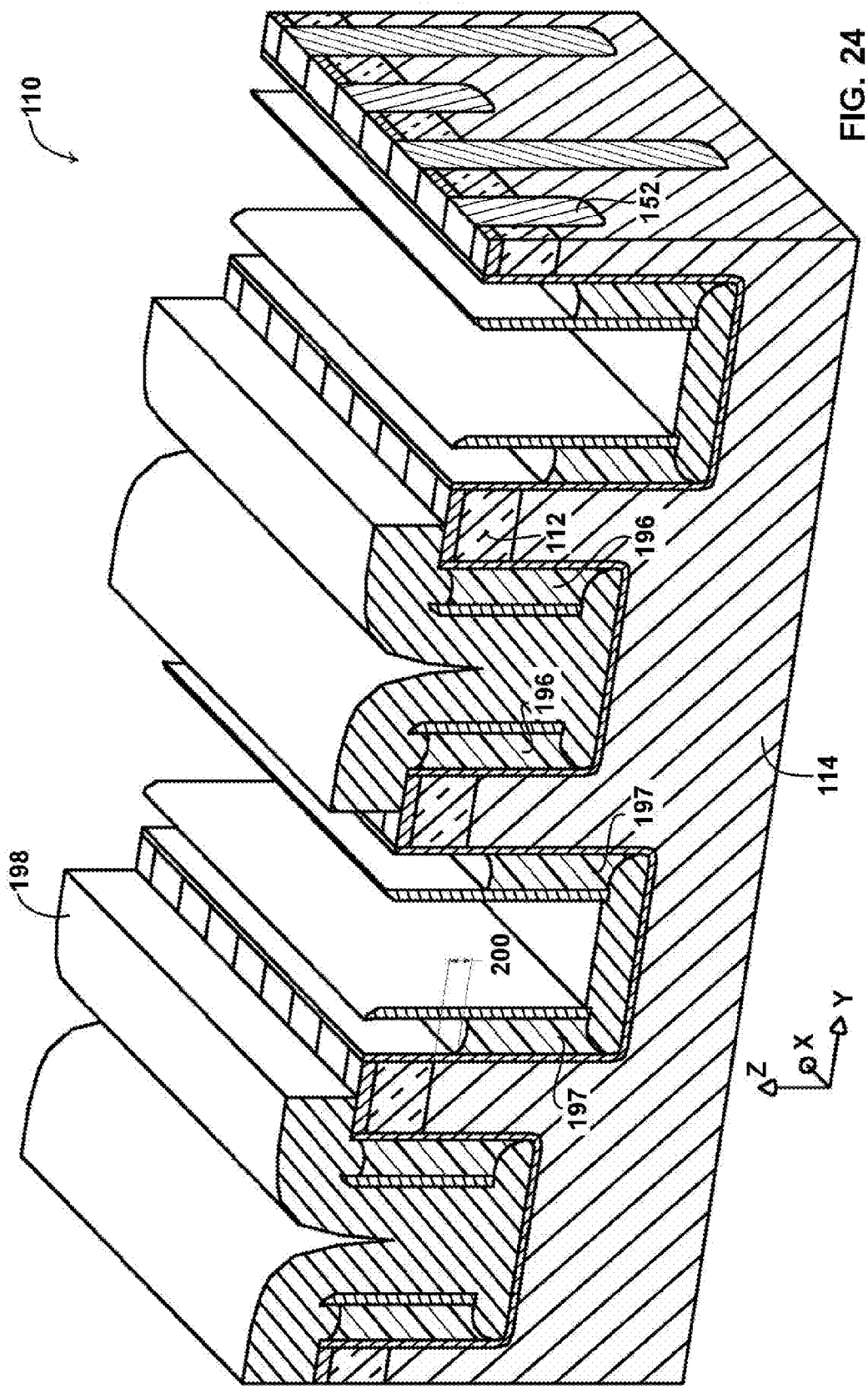

Next, the precursors to passive gates 194 may be recessed to form passive gates 197, as illustrated by FIG. 24. The passive gates 197 may be recessed with an etch that is generally selective to the passive gates 197. For instance, the passive gates 197 may be recessed with a wet etch, such as the SC1 etch described above. The passive gates 197 may be recessed a distance 202 below the upper doped region 112. The distance 202 may be greater than or equal to about 50 Å, 100 Å, 300 Å, or 500 Å. The passive gates 197, after being recessed, may overlap a portion of the intra-device trenches 152. After recessing the passive gates 197, the row mask 198 may be removed, e.g., with combustion or other appropriate processes.

Figure 25:
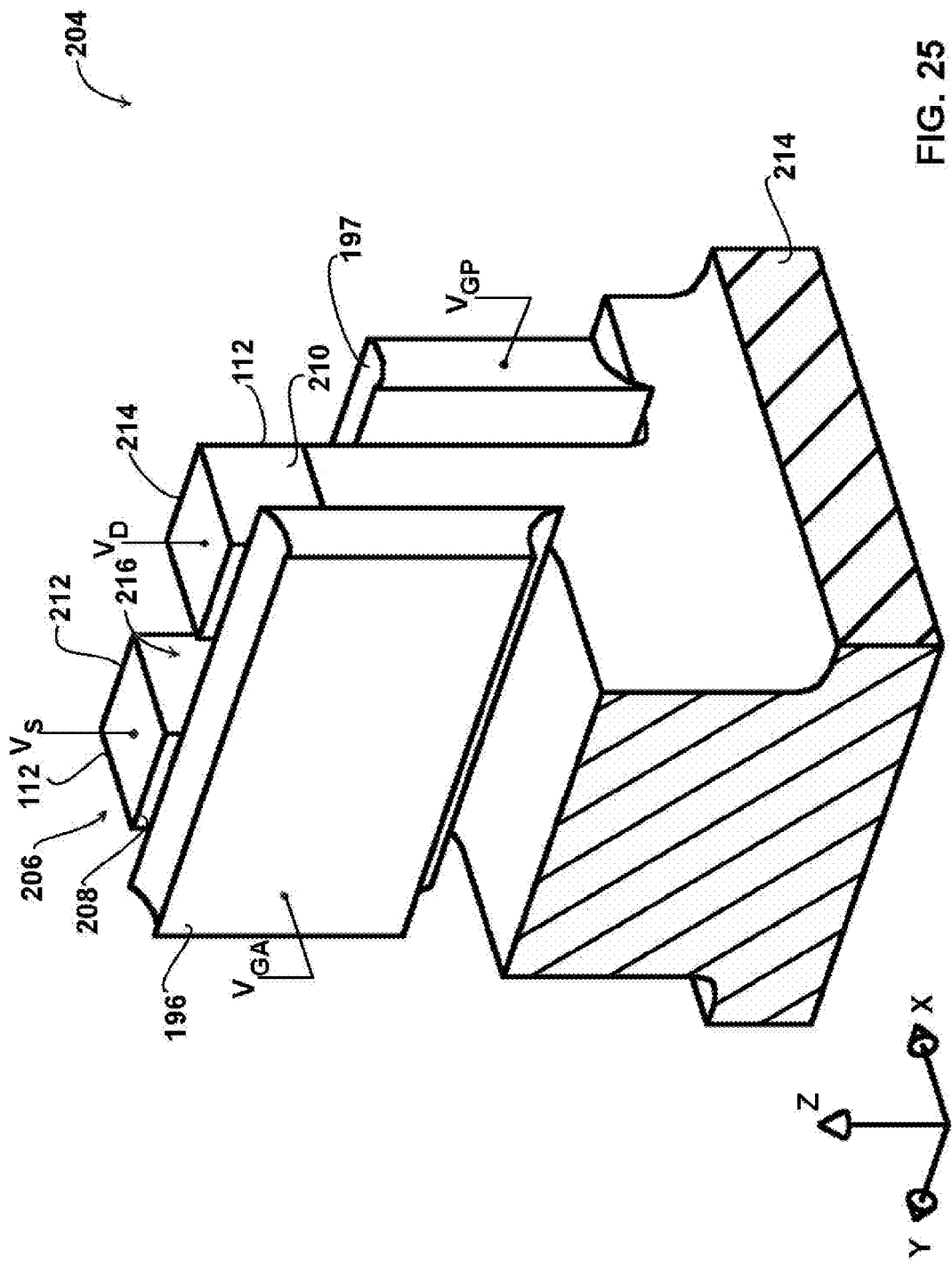

FIG. 25 illustrates an embodiment of a transistor 204 formed with the above-described process. The transistor 204 may include an asymmetric fin 206 having a shorter side 208 and a longer side 210. A plurality of asymmetric fins 206 may be part of each of the previously described fin rows 186 (FIG. 18). The asymmetric fin 206 may include a pair of legs 212 and 214 separated by a notch 216, corresponding to the intra-device trench 152 (FIG. 11). A distal portion of the legs 212 and 214 may be formed from the upper doped region 112, and a lower portion of the legs 212 and 214 may be formed from the lower doped region 214. The active gate 196 may be disposed near a shorter side 208 of the asymmetric fin 206, overlapping both the upper doped region 212 and the lower doped region 214, including a portion of the lower doped region 214 extending below the notch 216 between the legs 212 and 214. The passive gate 197 may be disposed near the longer side 210 of the asymmetric fin 206. The passive gate 197 may overlap the notch 216, but not the upper doped region 112.

In operation, the transistor 204 may control a current flowing between the legs 212 and 214. The current may be controlled in accordance with a voltage $V_{GA}$ of the active gate 196. The range of voltages $V_{GA}$ applied to the active gate 196 may fall into two categories: those above a threshold voltage of the transistor 204 and those below the threshold voltage. When $V_{GA}$ is above the threshold voltage, electric fields emanating from the active gate 196 may establish a conductive channel in the lower doped region 212, extending between the legs 212 and 214. In other embodiments, the transistor 204 may turn on in response to a $V_{GA}$ that is less than the threshold voltage. The resulting conductive channel extends generally vertically down one leg 212 or 214, generally horizontally under the notch 216, and then generally vertically back up the other leg 212 or 214. A difference in the voltages $V_S$ and $V_D$ applied to the legs 212 and 214 may drive a current through the channel, and the current may flow in either direction, depending on the relative values of $V_S$ and $V_D$. The channel may be disposed on the shorter side 208, but not the longer side 210, which is positioned near the passive gate 197.

The passive gate 197 may adjust the threshold voltage of the transistor 204. For instance, in transistors that turn on when the active gate 196 is elevated above the threshold voltage, the passive gate 197 may be at a voltage below the threshold voltage, e.g., a voltage less than the voltage of the lower doped region 214. The electric field emanating from the passive gate 197 may reduce the threshold voltage for the active gate 196, which is believed to reduce GIDL. For example, when the transistor 204 is turned off, the passive gate may be between about −3V and about 0V, and the active gate may be between about 0V and about 100 mV. The voltage difference between $V_S$ and $V_D$ may be about 2.5 V or less.

The voltage of the passive gate 197 may be held static when the transistor is turned on, e.g., when reading or writing to a memory device coupled to the legs 212 or 214. The voltage of substantially all of the passive gates 197 (FIG. 24) may be connected to a common voltage source that remains generally constant during operation of the transistors 204.

In other embodiments, the transistor 204 may turn on in response to the $V_{GA}$ dropping below the threshold voltage. In these embodiments, the $V_{GP}$ may be positive, thereby elevating the threshold voltage when the transistor 204 is turned off and reducing GIDL.

Figure 26:
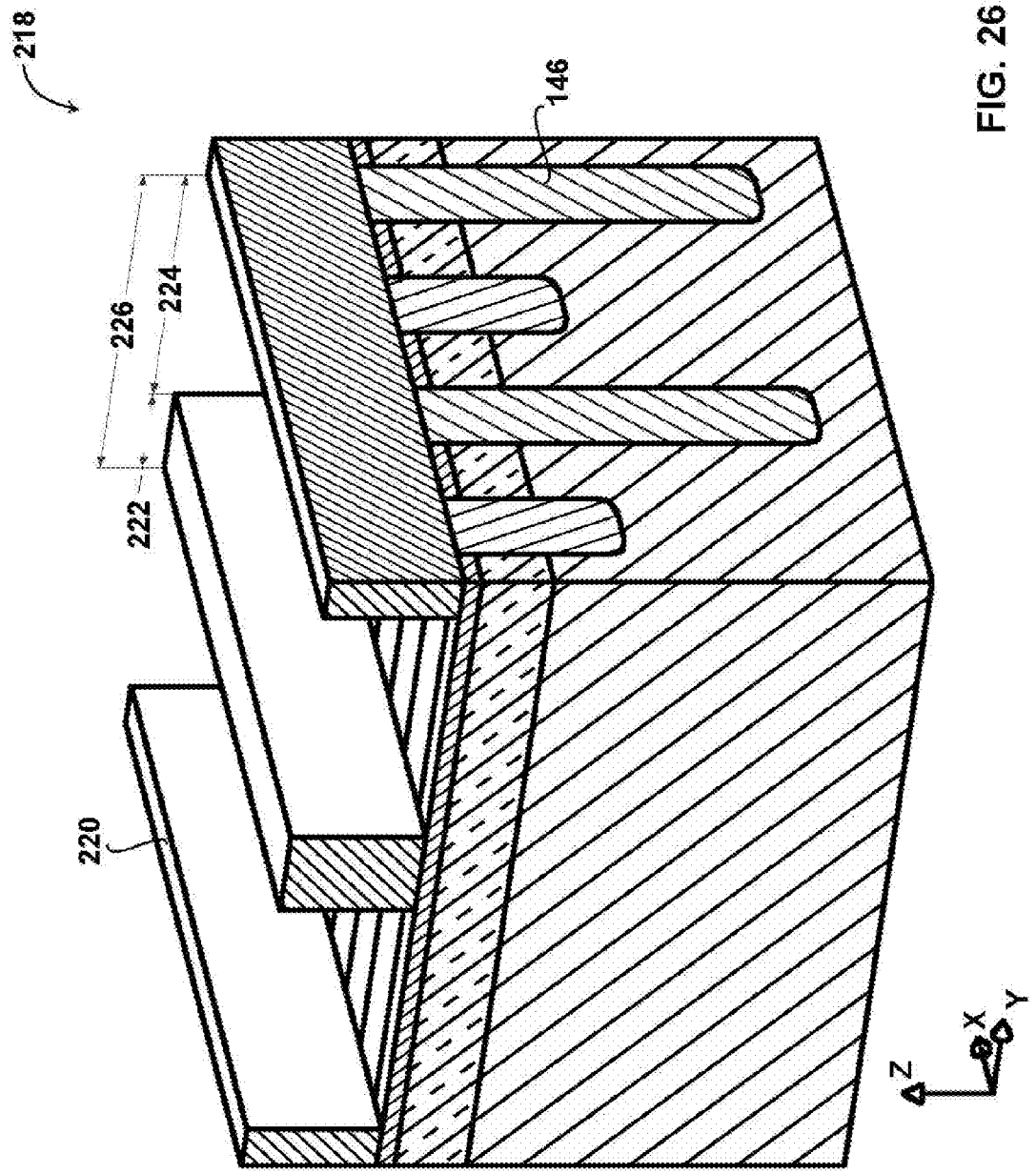
FIGS. 26-33 illustrate a second example of a process for forming an array of transistors in accordance with an embodiment of the present technique.

FIGS. 26-33 illustrate another embodiment of a process for forming an array of transistors. As illustrated by FIG. 26, the process may include obtaining, e.g., manufacturing or contracting with a foundry to manufacture, a substrate 218 formed with the steps described above with reference to FIGS. 1-13.

After obtaining the substrate 218, the process may include forming a row mask 220 on the substrate 218, as illustrated by FIG. 26. The row mask 220 may be a hard mask or a soft mask formed with photolithography or other lithographic techniques. For instance, row mask 220 may be a mask formed with sub-photolithographic techniques, such as a sidewall-spacer process, resist-reflow process, or a wet-etch-undercut process. The row mask 220 may include masked regions having a width 222 and exposed regions having a width 224. The masked width 222 may be about equal to or less than F, ½ F, or ¾ F. The masked regions and exposed regions may repeat with a period 226, or the pattern may be interrupted with other structures. The row mask 220 may extend substantially in the X-direction, substantially orthogonal to the dielectric 146. The row mask 220 may be substantially straight, have substantially uniform widths 222 and 224, and be generally parallel. In other embodiments, the row mask 220 may undulate side-to-side, may undulate up-and-down, may vary in widths 222 and 224, or may be segmented.

Figure 27:
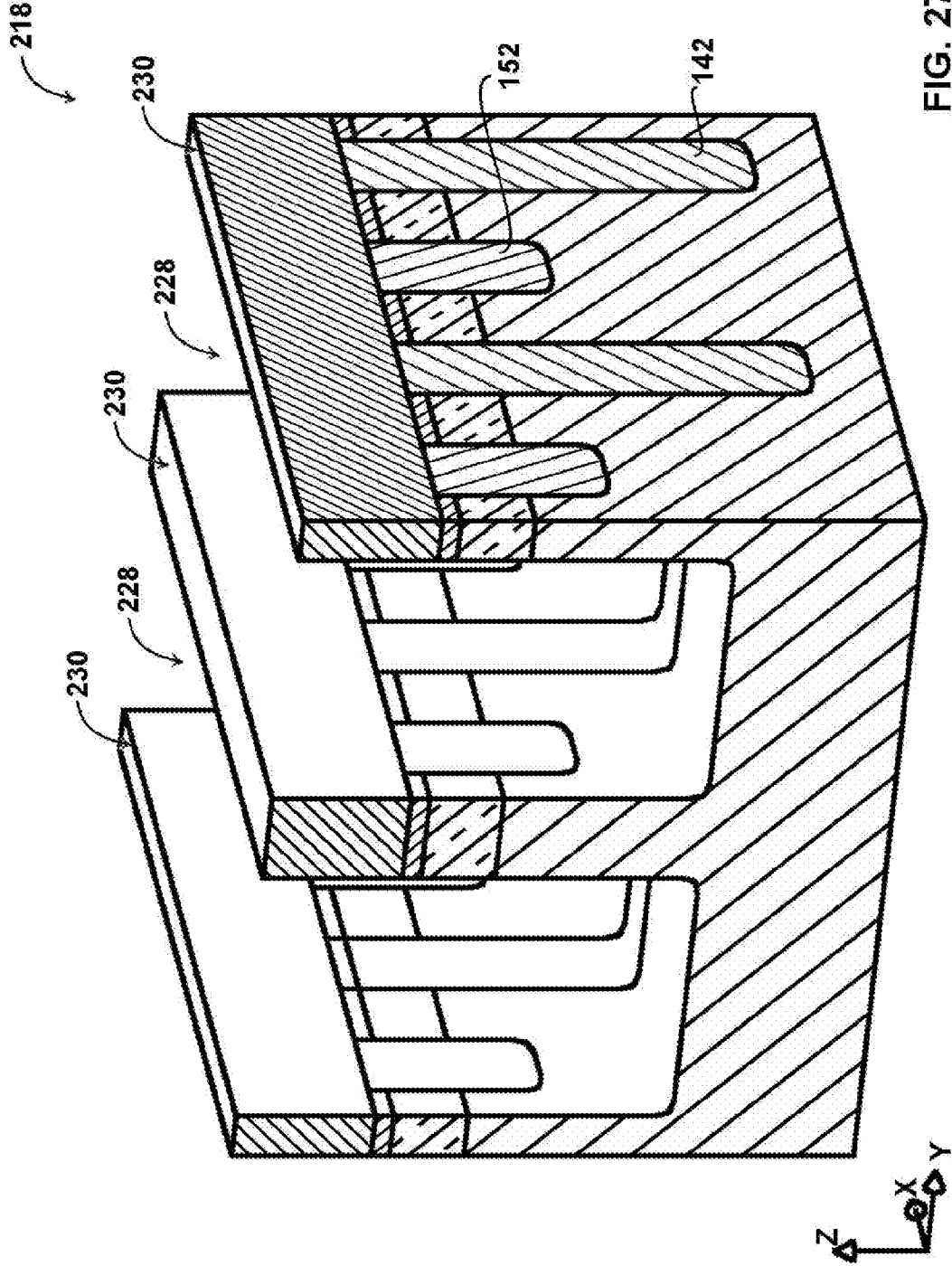

Next, as illustrated by FIG. 27, row trenches 228 may be formed. The row trenches 228 may be formed with a wet etch or a dry etch that etches the exposed materials at substantially similar rates. The depth of the row trenches 228 may be deeper than the intra-device trenches 152, and not as deep as the column isolation trenches 142. The etch may form fin rows 230 that extend substantially in the X-direction and rise from the substrate 218 substantially in the Y-direction.

Figure 28:
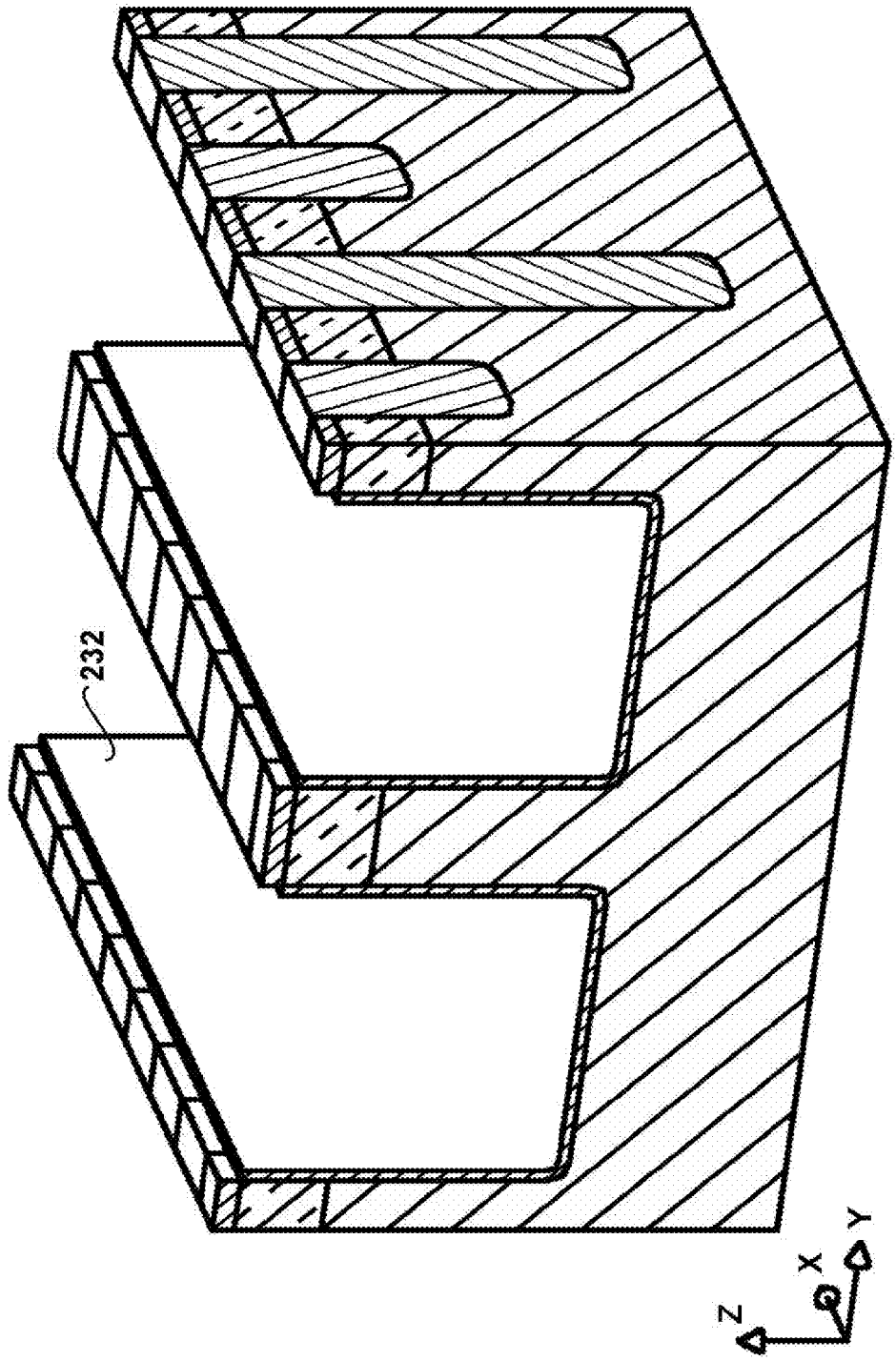

After forming the row trenches 228, a gate dielectric 232 may be formed, as illustrated by FIG. 28. The gate dielectric 232 may be formed with a variety of processes and materials, such as those described above with reference to FIG. 19.

Figure 29:
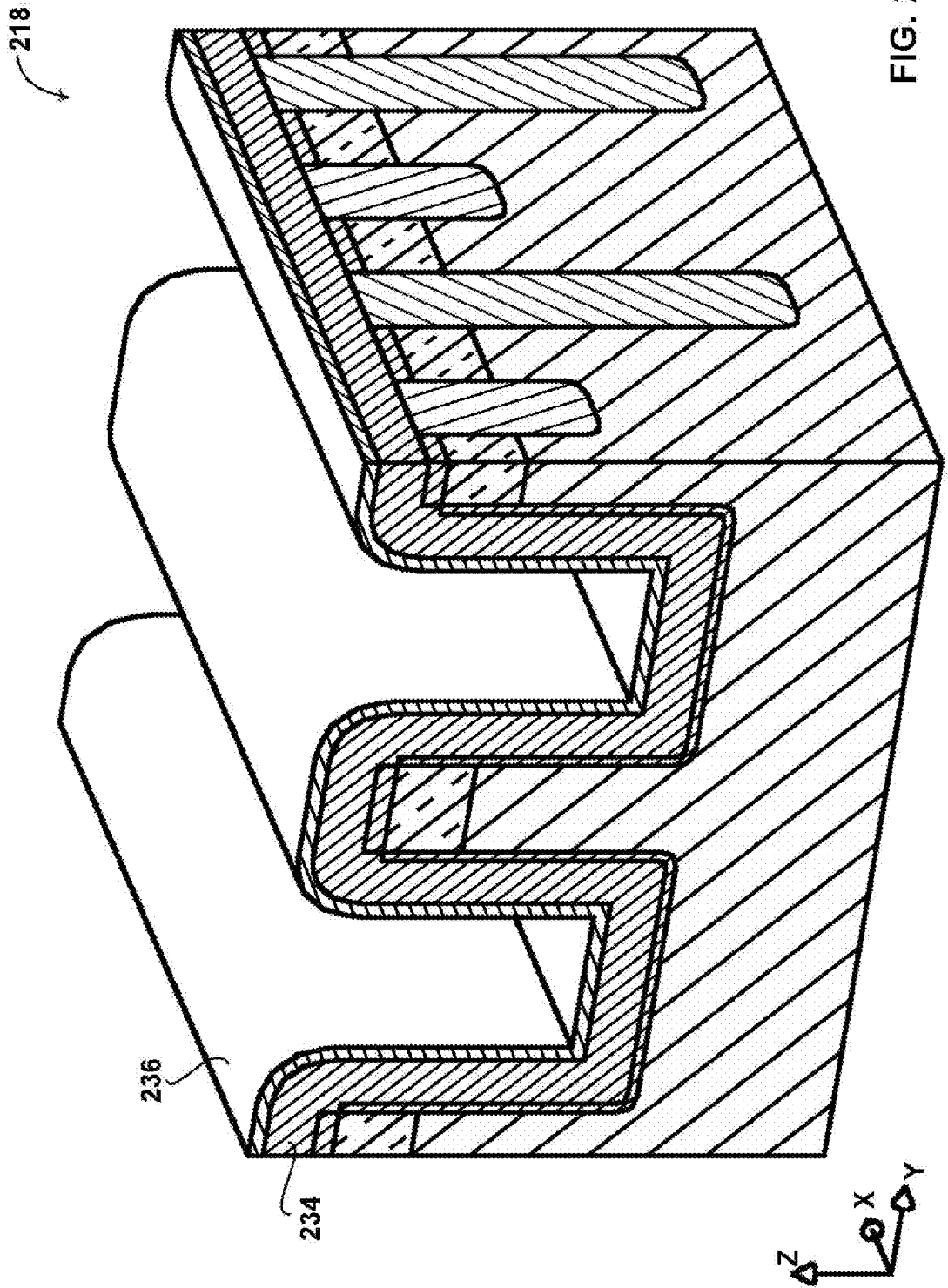
Figure 30:
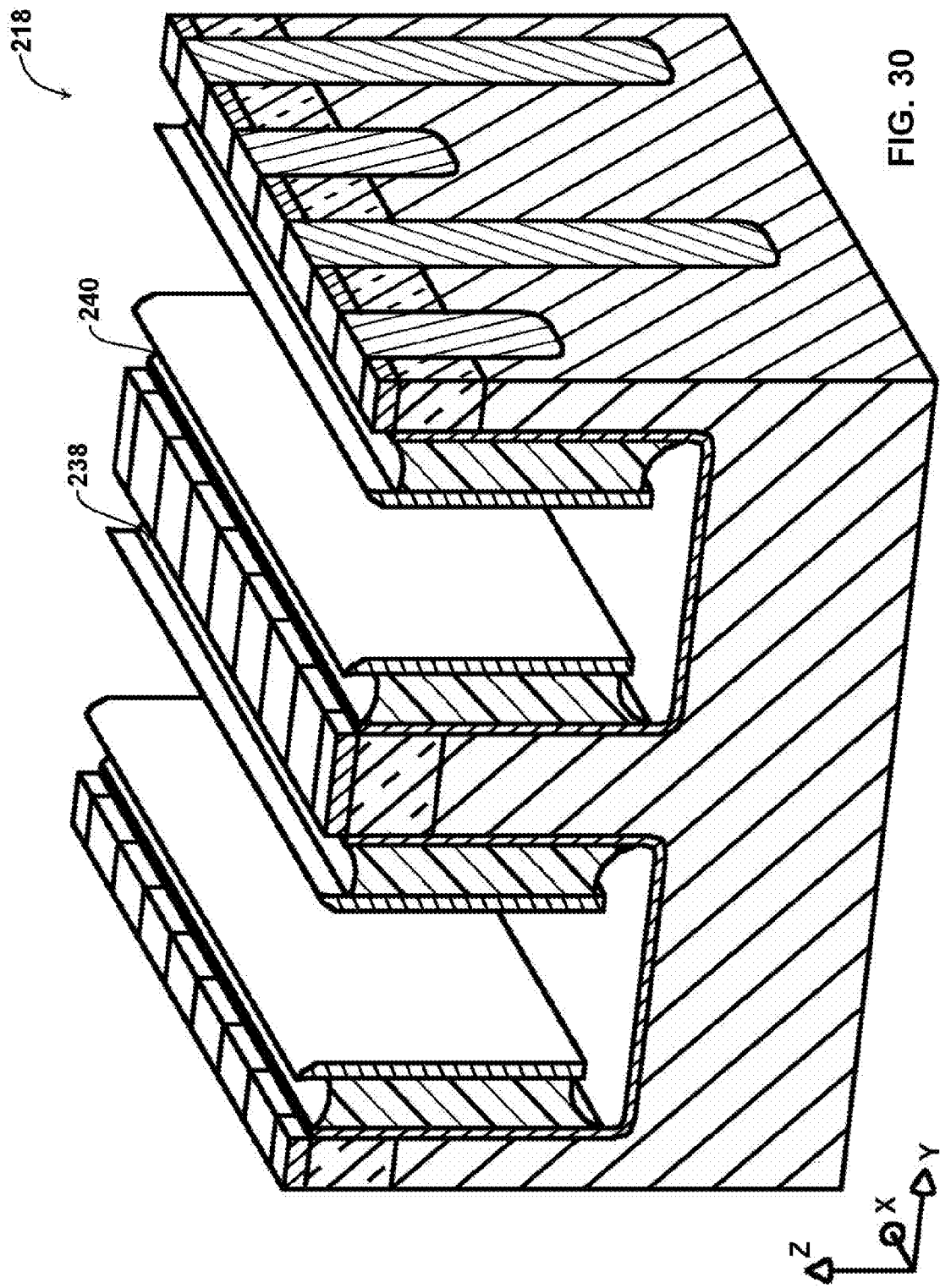

Next, a gate material 234 and a protective material 236 may be formed on the substrate 218, as illustrated by FIG. 29, and passive gates 238 and active gates 240 may be formed, as illustrated by FIG. 30. These materials 234 and 236 and structures 238 and 240 may be formed with materials and processes similar to those described above with reference to FIGS. 20-22.

Figure 31:
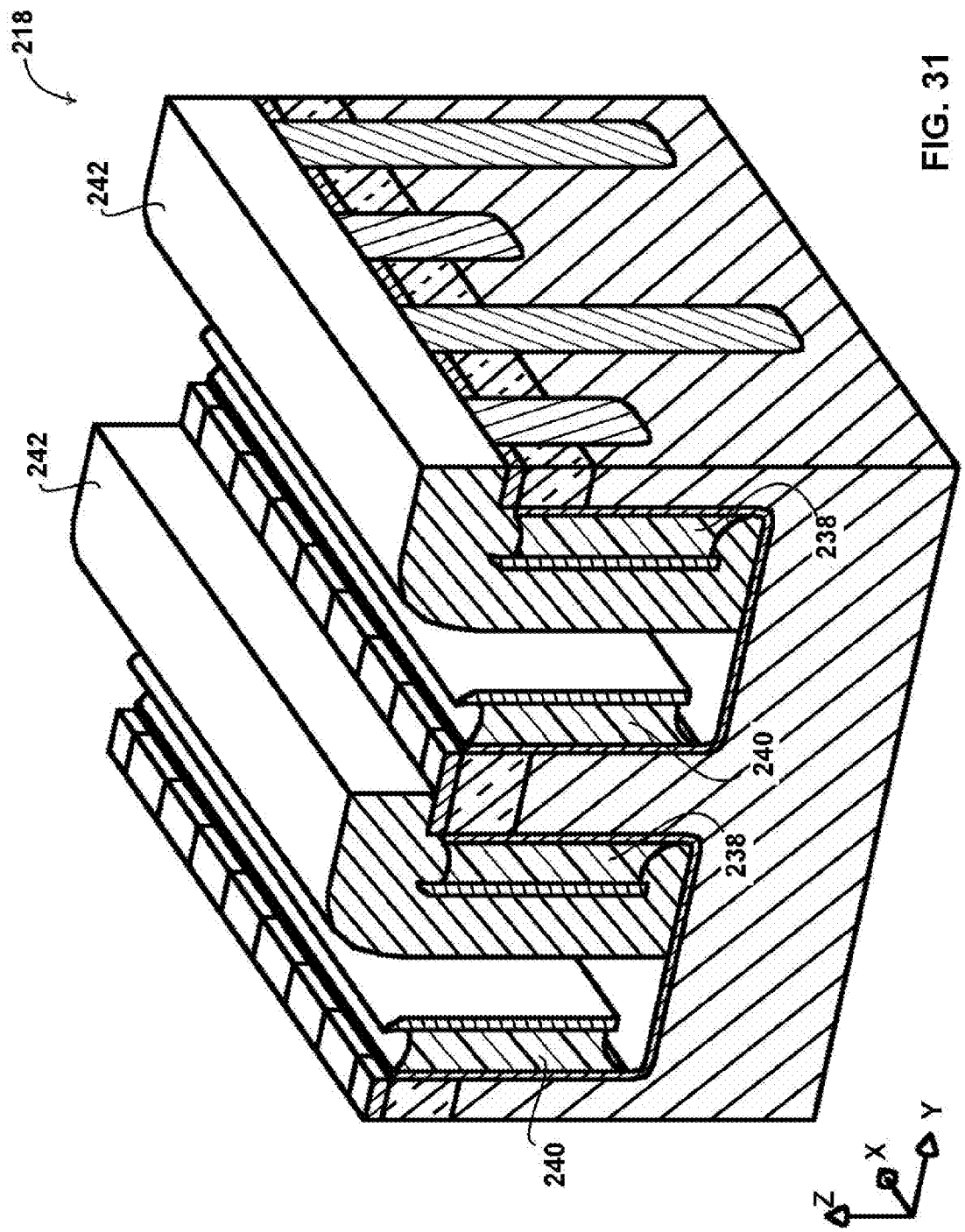

After forming the active gate 238 and the passive gate 240, an active-gate mask 242 may be formed on the substrate 218, as illustrated by FIG. 31. The active-gate mask 242 may be a soft mask or a hard mask formed with photolithography or other lithographic techniques. The active-gate mask 242 may cover a portion or substantially all of the active gates 238, while leaving a portion or substantially all of the passive gates 240 exposed.

Figure 32:
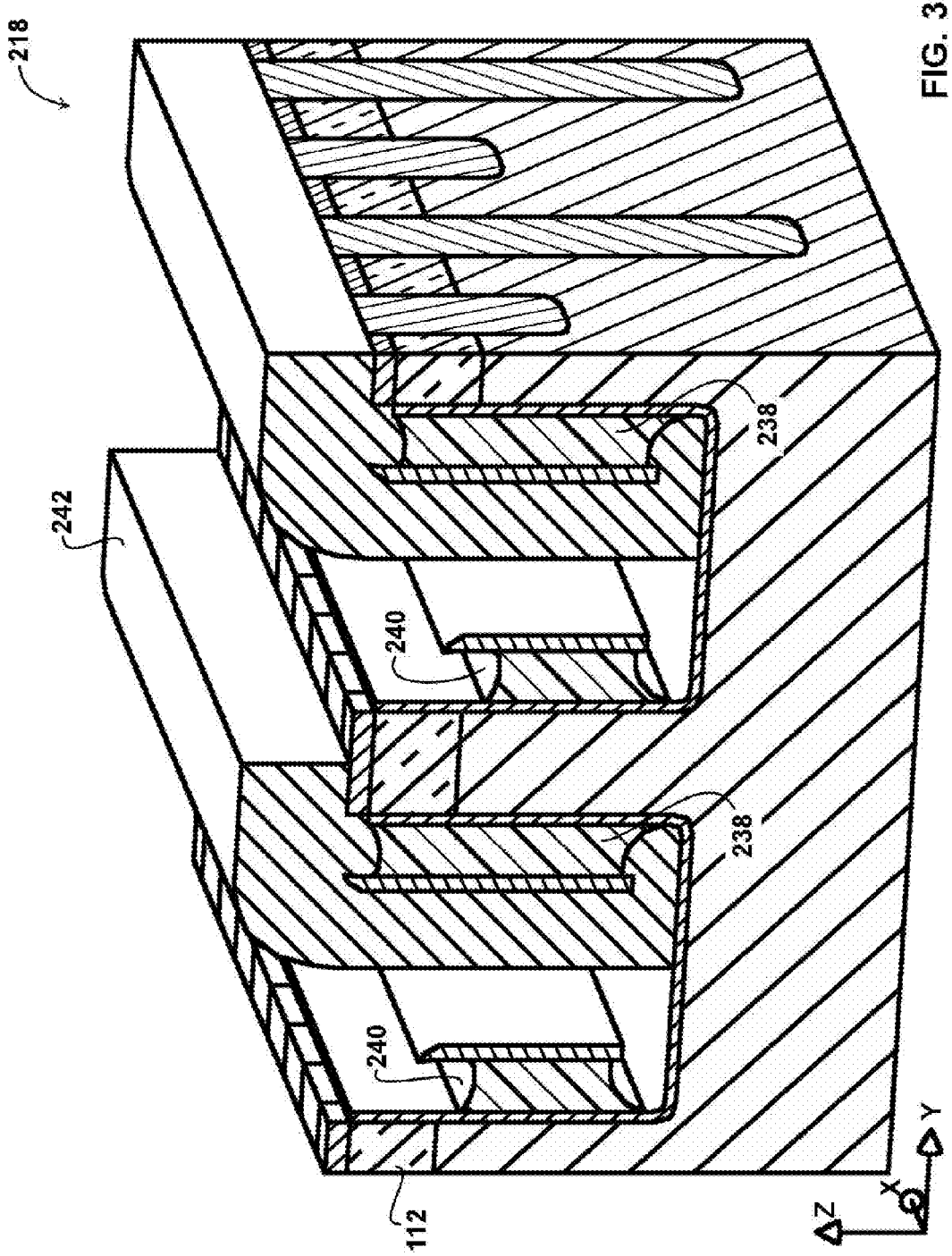

Next, the passive gates 240 may be recessed, as illustrated by FIG. 32. The passive gates 240 may be recessed with a dry etch or a wet etch. The top of the passive gates 240 may be recessed below the upper doped region 112, or the passive gates 240 may be recessed below the top of the active gates 238 and subsequent processing, e.g., cleaning steps, may further recess the passive gates 240 below the upper doped region 112.

Figure 33:
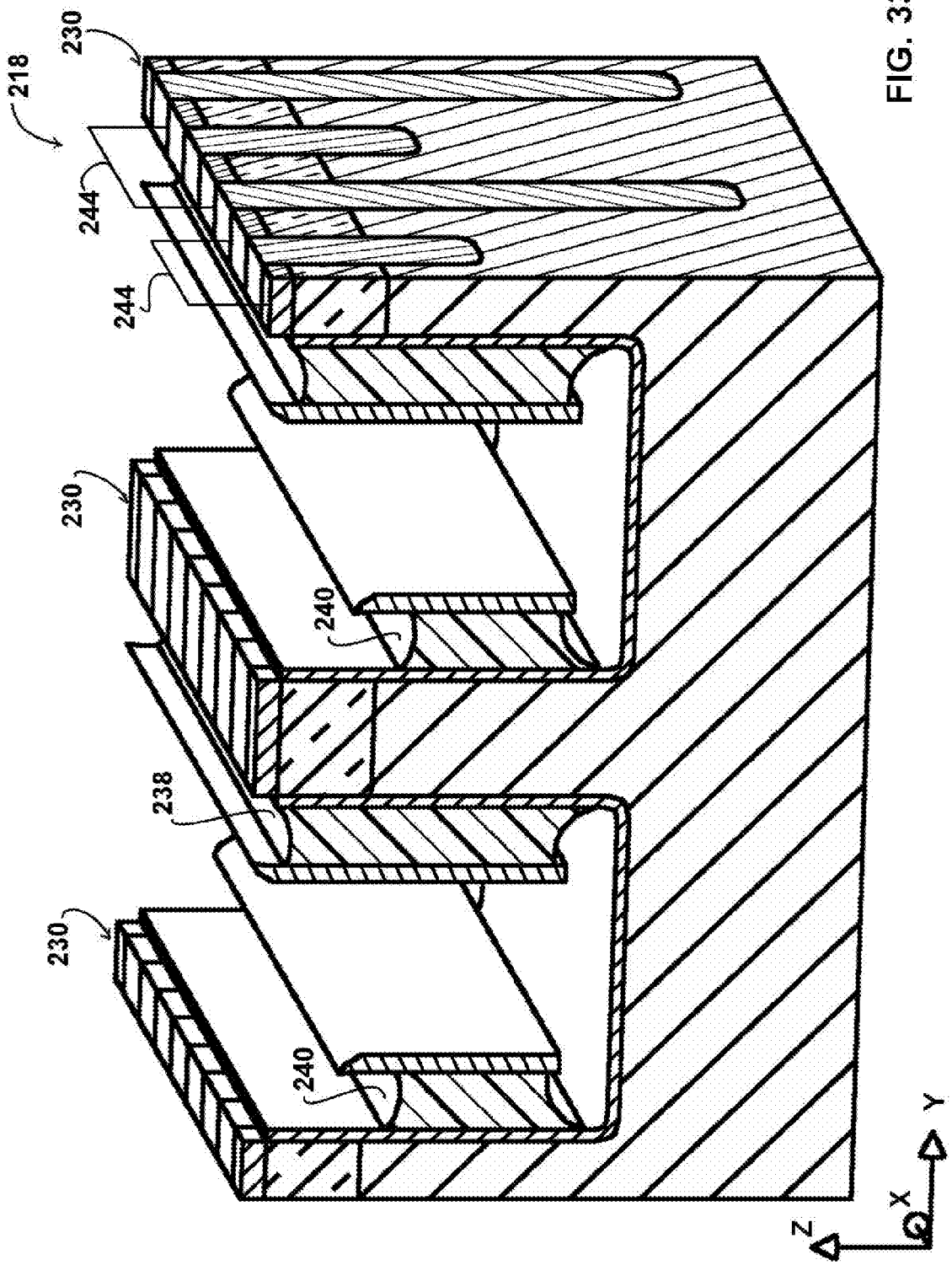

Finally, the active-gate mask 242 may be removed, as illustrated by FIG. 33. The active-gate mask 242 may be removed by combustion or other processes.

After removing the active-gate mask 242, the substrate 218 may include a plurality of transistors 244 that are similar to the transistor 204 described above with respect to FIGS. 24 and 25. The transistors 244 (FIG. 33) and the transistors 204 (FIG. 24) may have differences. For instance, in this embodiment, each of the fin rows 230 may be oriented in generally the same direction, with active gates 238 facing the passive gates 240 on adjacent fin rows 230, while the previous embodiment may include fin rows 186 (FIG. 23) oriented in different, alternating directions.

In operation, as with the previously described transistor 204 (FIG. 25), the passive gate 240 may adjust the threshold voltage of the transistors 244, and the active gate 238 may control current through the transistors 244. The threshold voltage may be adjusted to reduce GIDL.

Figure 34:
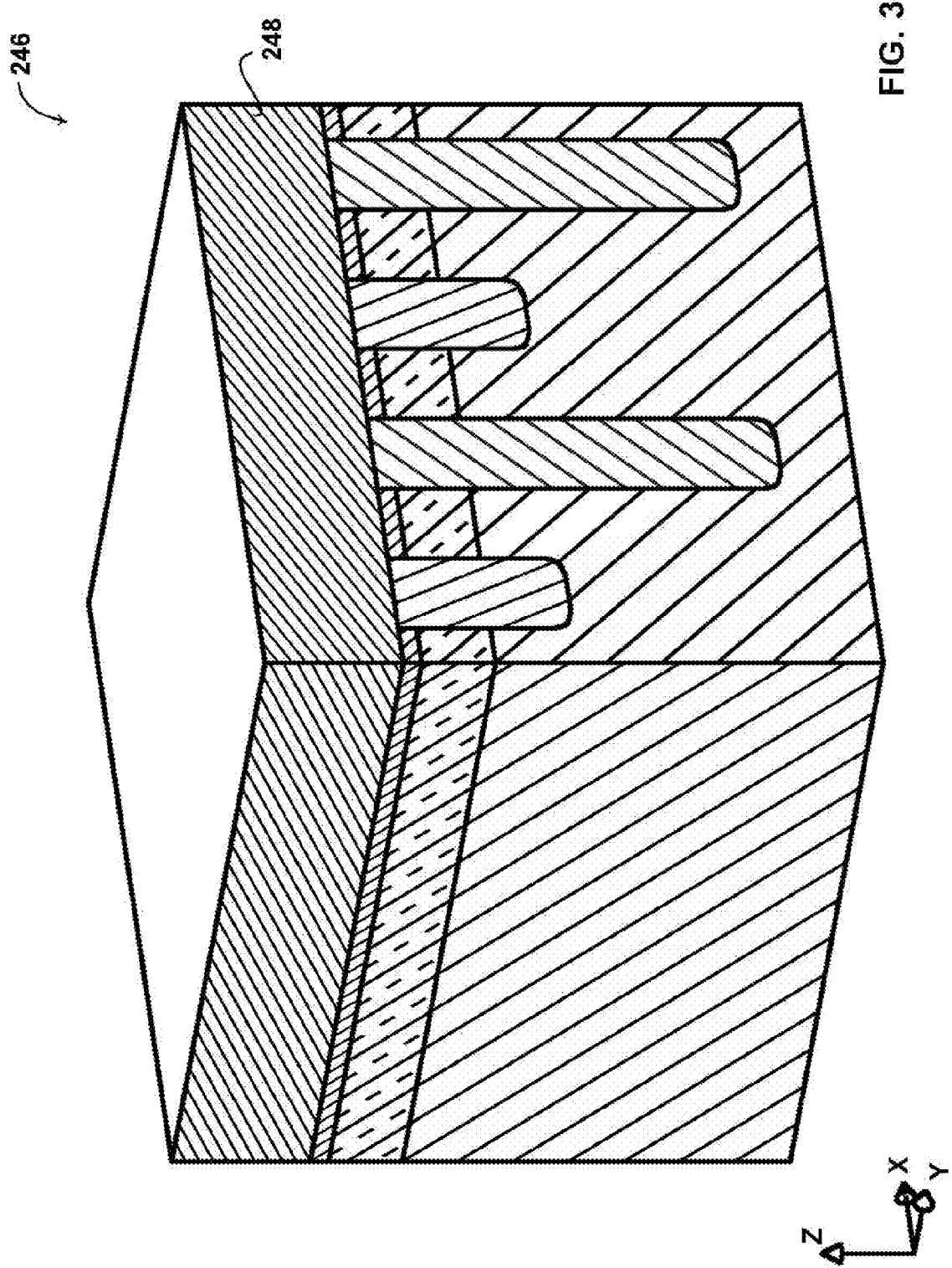
FIGS. 34-45 illustrate a third example of a process for forming an array of transistors in accordance with an embodiment of the present technique.

FIGS. 34-45 illustrate another example of a process for forming an array of transistors. As illustrated by FIG. 34, the process may include obtaining a substrate 246 like the one produced above with the steps illustrated by FIGS. 1-13.

After obtaining the substrate 246, the process may include forming a sacrificial body 248, as depicted by FIG. 34. The sacrificial body 248 may include one or more films with a combined thickness between about 550 Å and about 2450 Å, e.g., the sacrificial body 248 may be an oxide film with a thickness of about 1500 Å. In other embodiments, other materials, such as a nitride film, or thicknesses of materials may function as the sacrificial body 248 in accordance with various embodiments of the present technique that include a sacrificial body 248.

Figure 35:
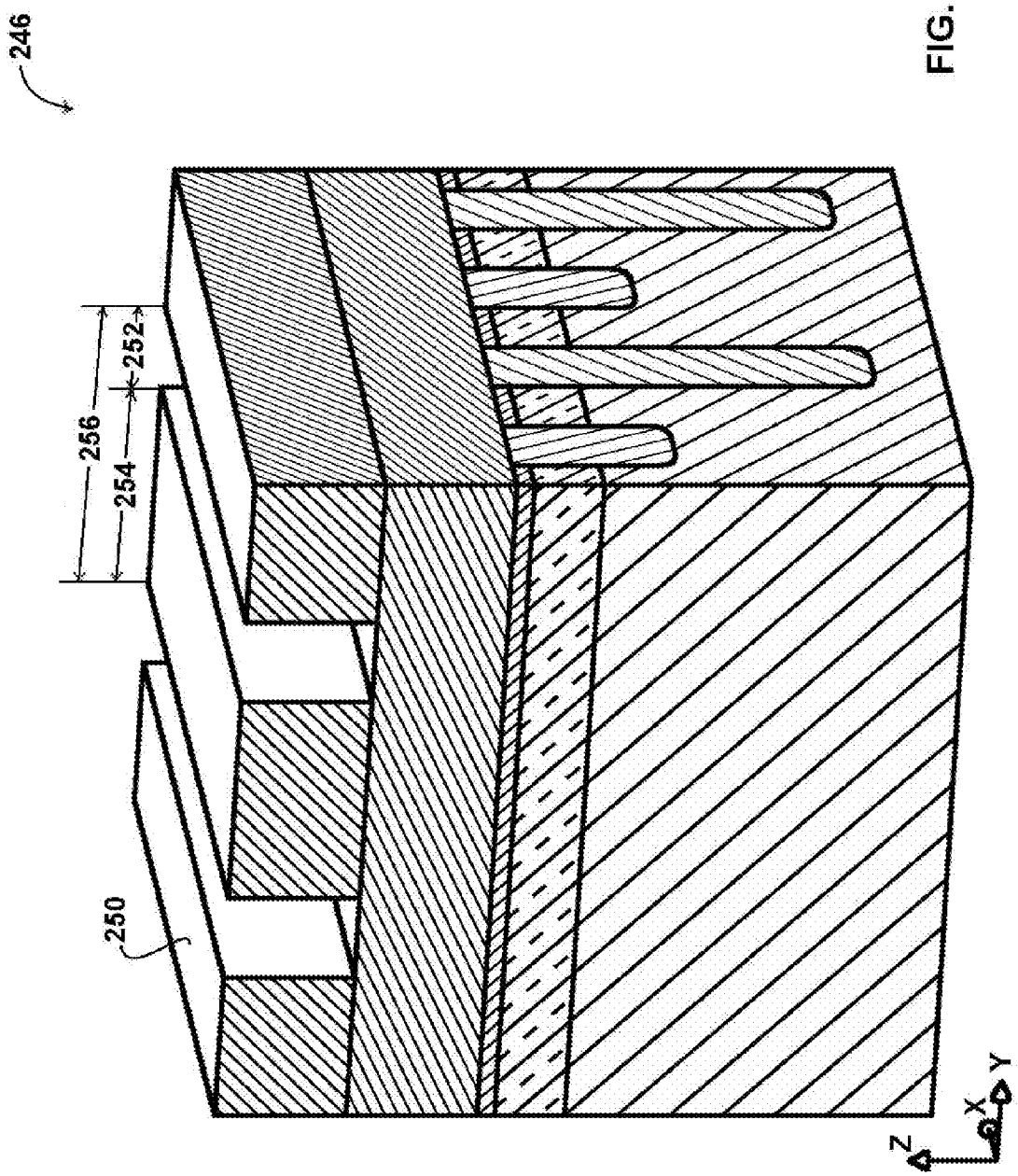

Next, a row mask 250 may be formed, as illustrated by FIG. 35. The row mask 250 may be a hard mask or a soft mask formed with photolithography or other lithographic techniques. For instance, row mask 250 may be a mask formed with sub-photolithographic techniques, such as one or more of those described above. The row mask 250 may include masked regions having a width 252 and exposed regions having a width 254. The masked width 252 may be about equal to or less than F, ½ F, or ¾ F. The masked regions and exposed regions may repeat with a period 256, or the pattern may be interrupted with other structures. The row mask 250 may extend substantially in the X-direction, substantially orthogonal to the dielectric 146 (FIG. 8). The row mask 250 may be substantially straight, have substantially uniform widths 252 and 254, and be generally parallel. In other embodiments, the row mask 250 may undulate side-to-side, may undulate up-and-down, may vary in widths 252 and 254, or may be segmented.

Figure 36:
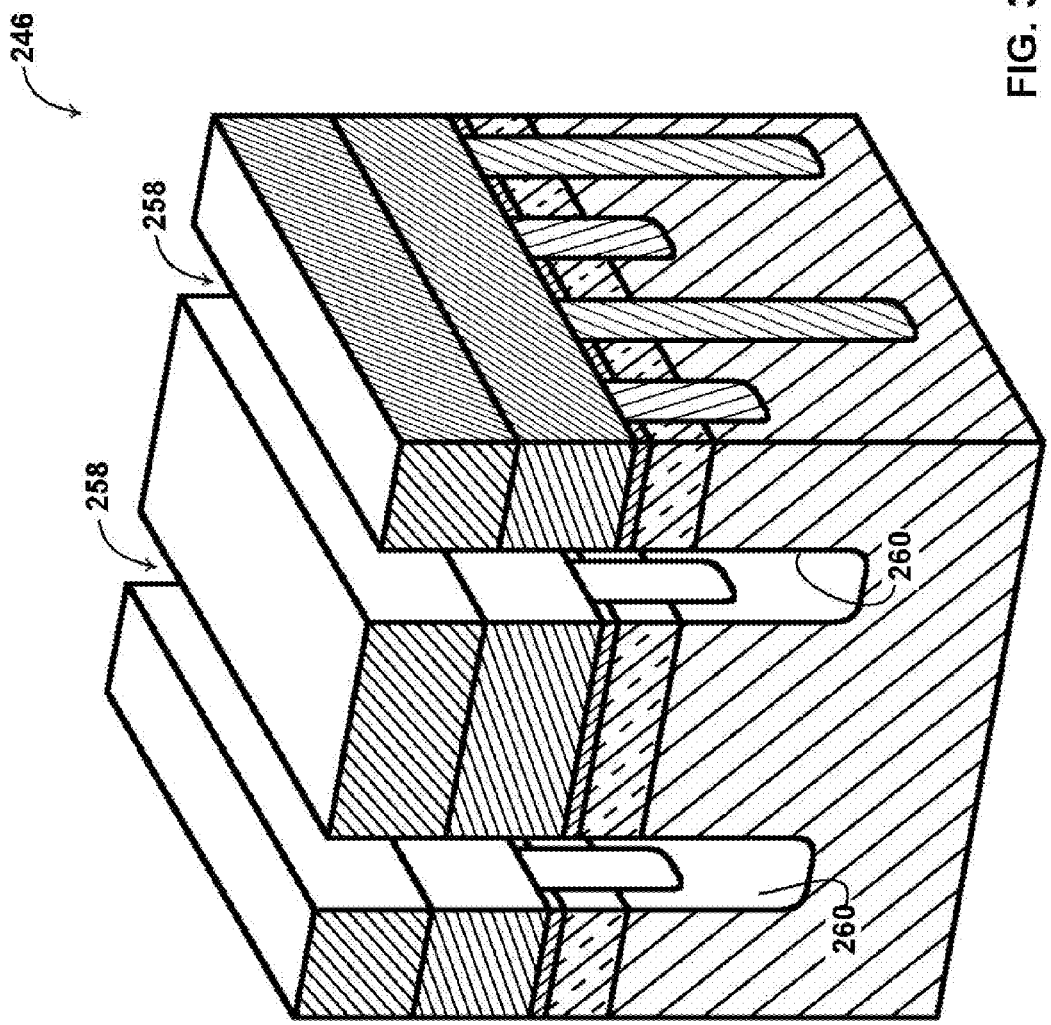

Next, passive-gate trenches 258 may be formed, as depicted by FIG. 36. The passive-gate trenches 258 may be etched from the substrate 246 with, for example, an anisotropic dry etch. In a cross-section normal to the X-direction, the passive-gate trenches 258 may be generally rectangular or trapezoidal. Alternatively, the passive-wall trenches may have a cross-section with some other shape. In one embodiment, the passive-gate trenches 258 may be deeper than the intra-device trench 152 and shallower than the column isolation trenches 142 (FIG. 11). The sidewalls of the passive-gate trenches 258 form passive walls 260, which may each form a first wall or side of a subsequently-formed fin.

Figure 37:
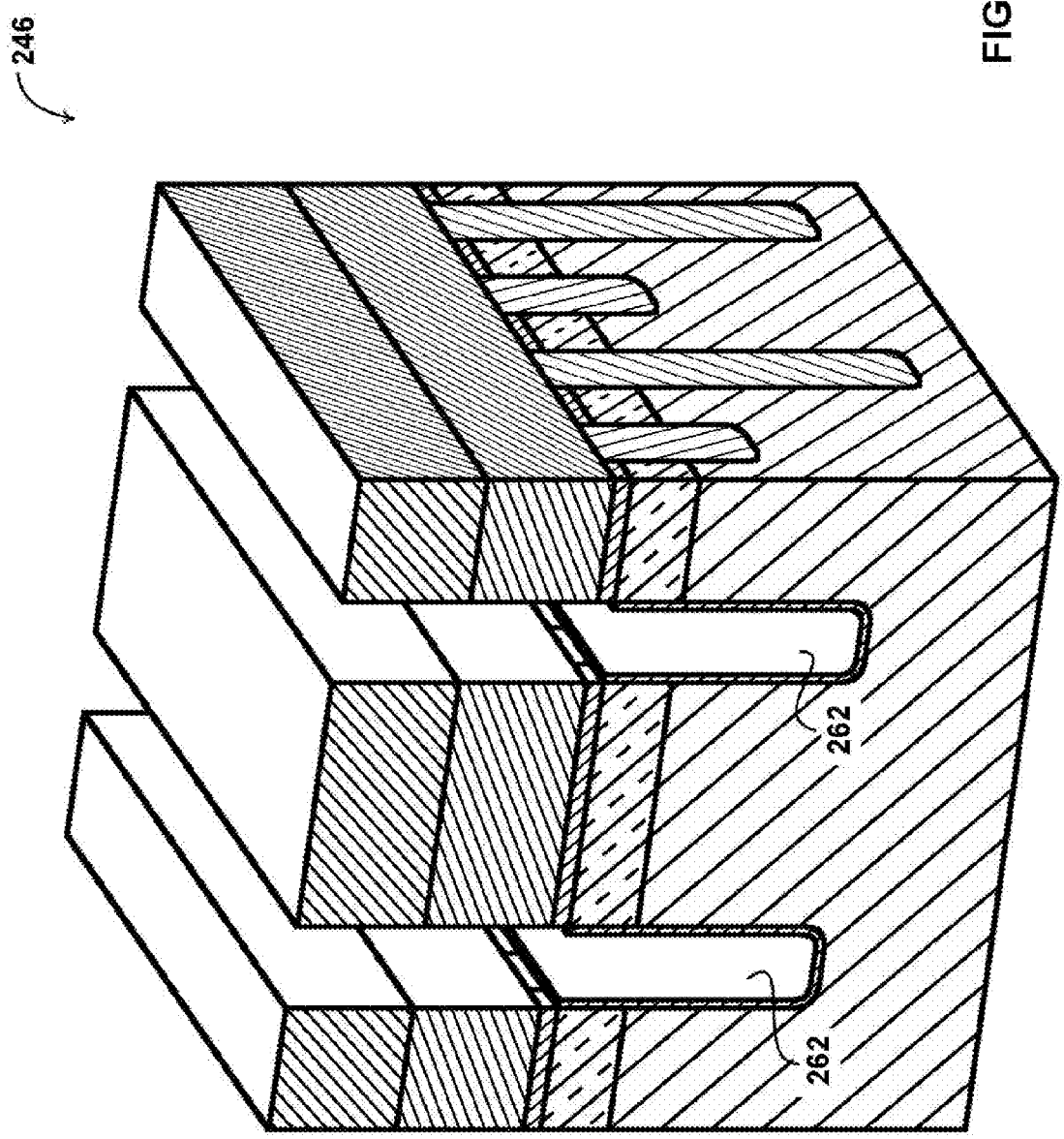

After forming the passive-gate trenches 258, a passive-gate dielectric 262 may be formed, as illustrated by FIG. 37. The passive-gate dielectric 262 may be formed with a variety of processes and dielectric materials, such as those described above with reference to FIG. 19.

Figure 38:
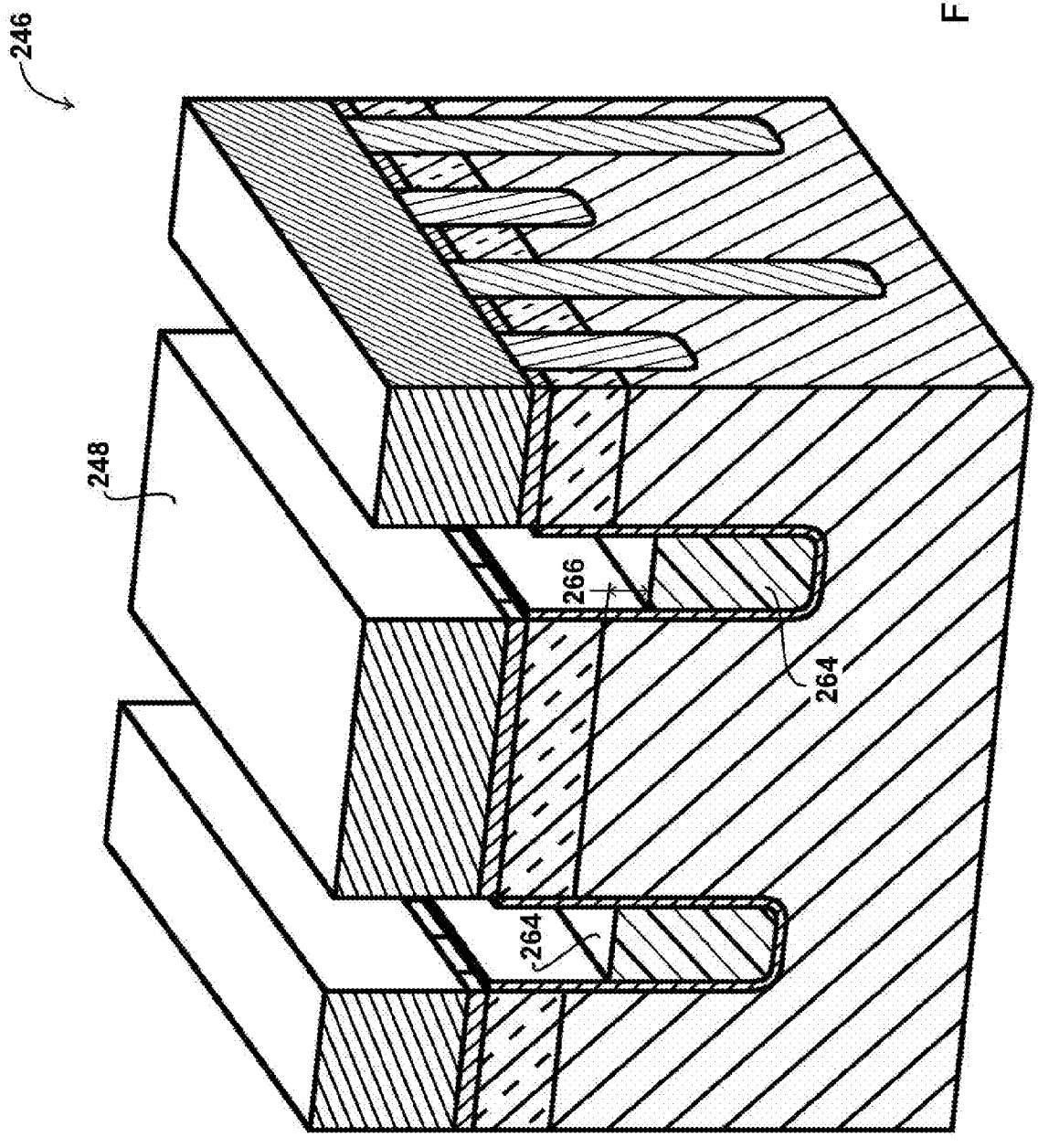

Next, passive gates 264 may be constructed, as depicted by FIG. 38. The passive gates 264 may be disposed at least partially or substantially entirely in the passive-gate trenches 258. The passive gates 264 may include a conductive material, such as a p-plus doped polysilicon, conductive metals, or other appropriate work function material, for example. The conductive material may be deposited and, then, etched back, thereby recessing the conductive material below the surface of the substrate 246 and the sacrificial body 248. The passive gates 264 may be recessed below the upper doped region 112, such that the passive gates 264 overlap the lower doped region 114, but not the upper doped region 112. For example, the passive gates 264 may be recessed a distance 266 below the upper doped region 112 that is greater than or equal to about 100 Å, 200 Å, or 500 Å.

Figure 39:
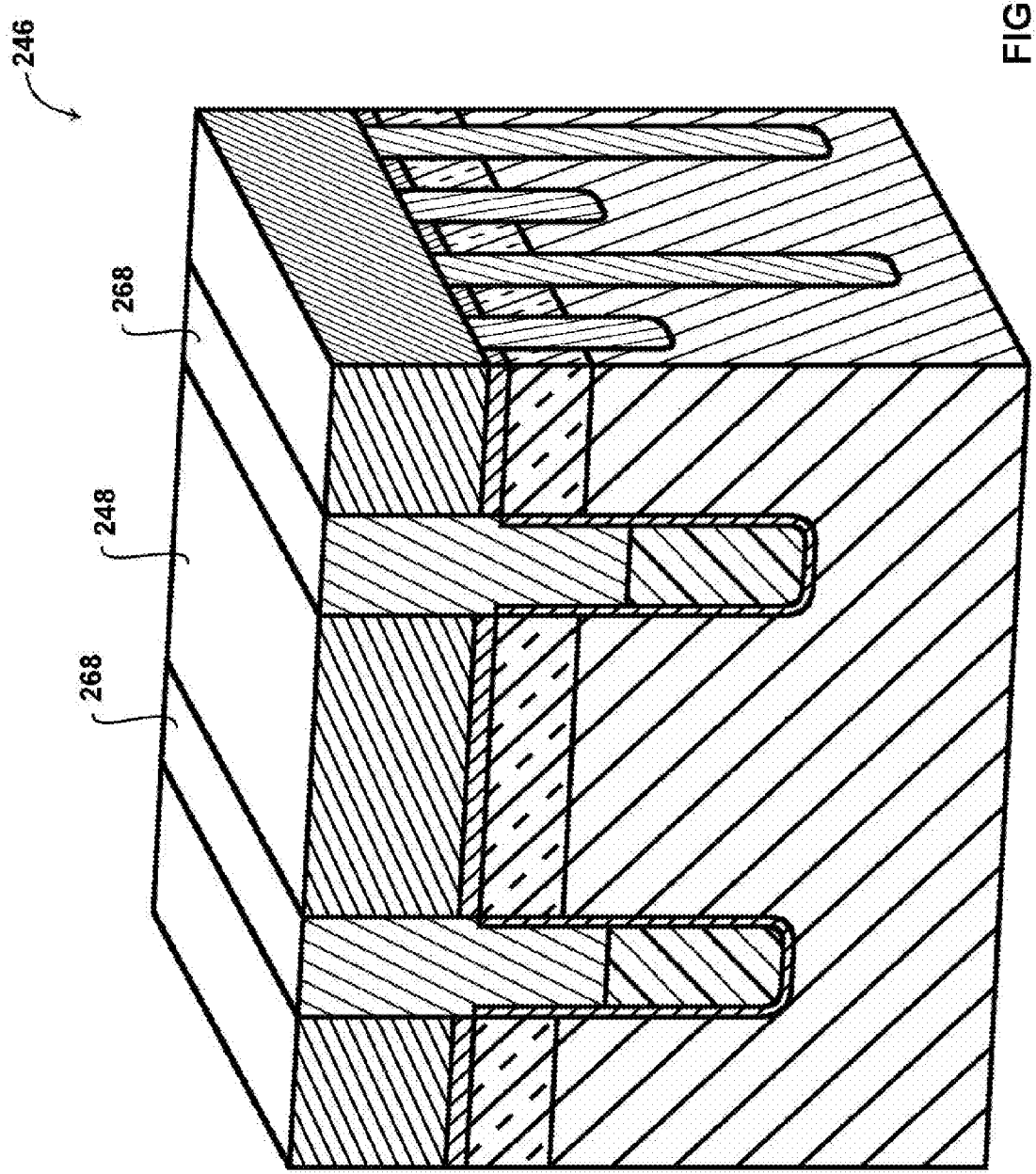

Next, protective plugs 268 may be formed above the passive gates 264, as depicted by FIG. 39. The protective plugs 268 may include silicon nitride or other appropriate materials. The protective plugs 268 may be deposited and etched or polished back until they are generally planar with, or recessed below, the surface of the sacrificial body 248. The protective plugs 268 may act as a reference structure for forming self-aligned fins on either side of the protective plugs 268.

Figure 40:
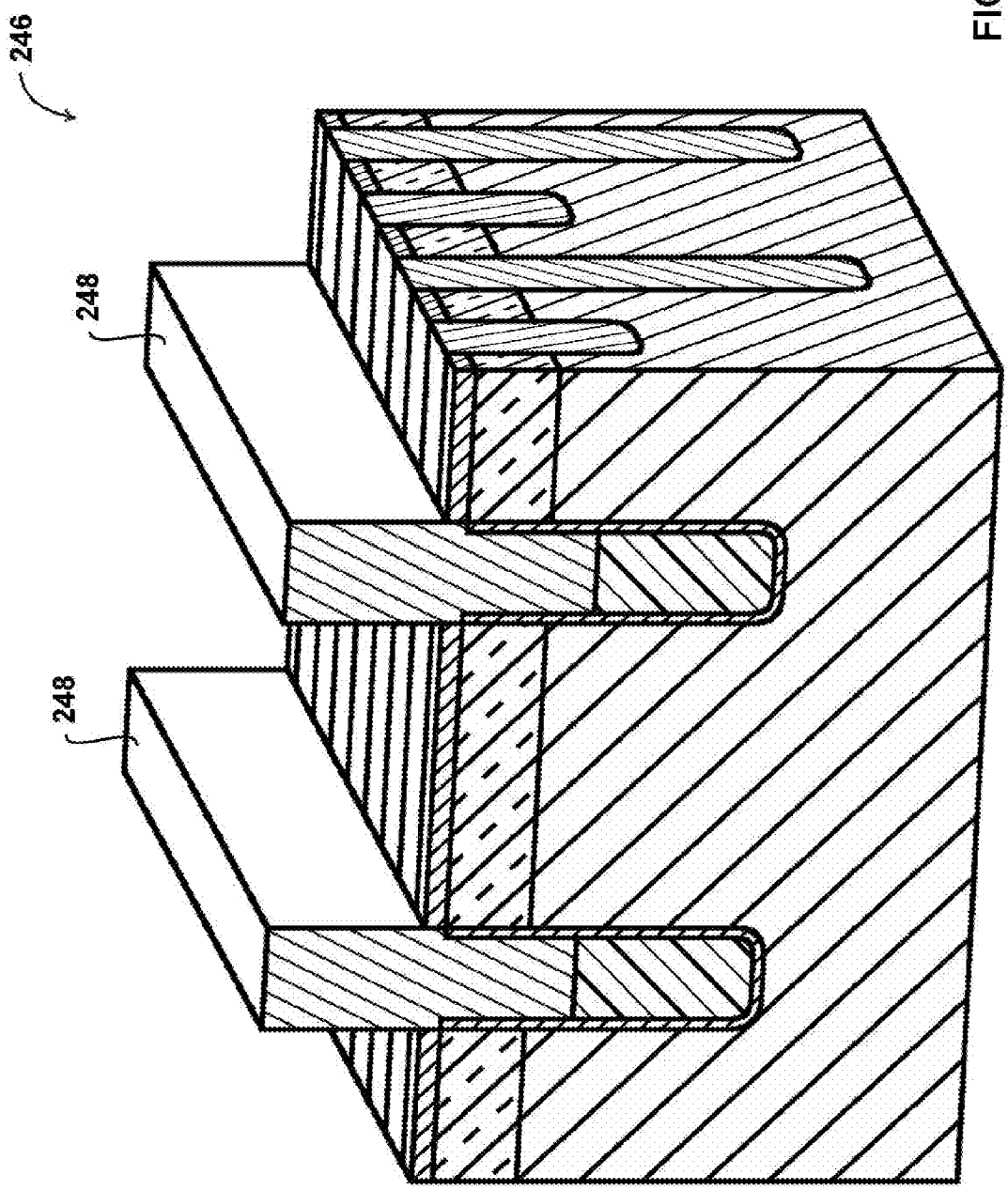

After forming the protective plugs 268, the sacrificial body 248 may be removed, as illustrated by FIG. 40. The sacrificial body 248 may be removed with a wet or dry etch that is selective to the sacrificial body 248. At this stage, the protective plugs 268 may protrude above the surface of the substrate 246.

Figure 41:
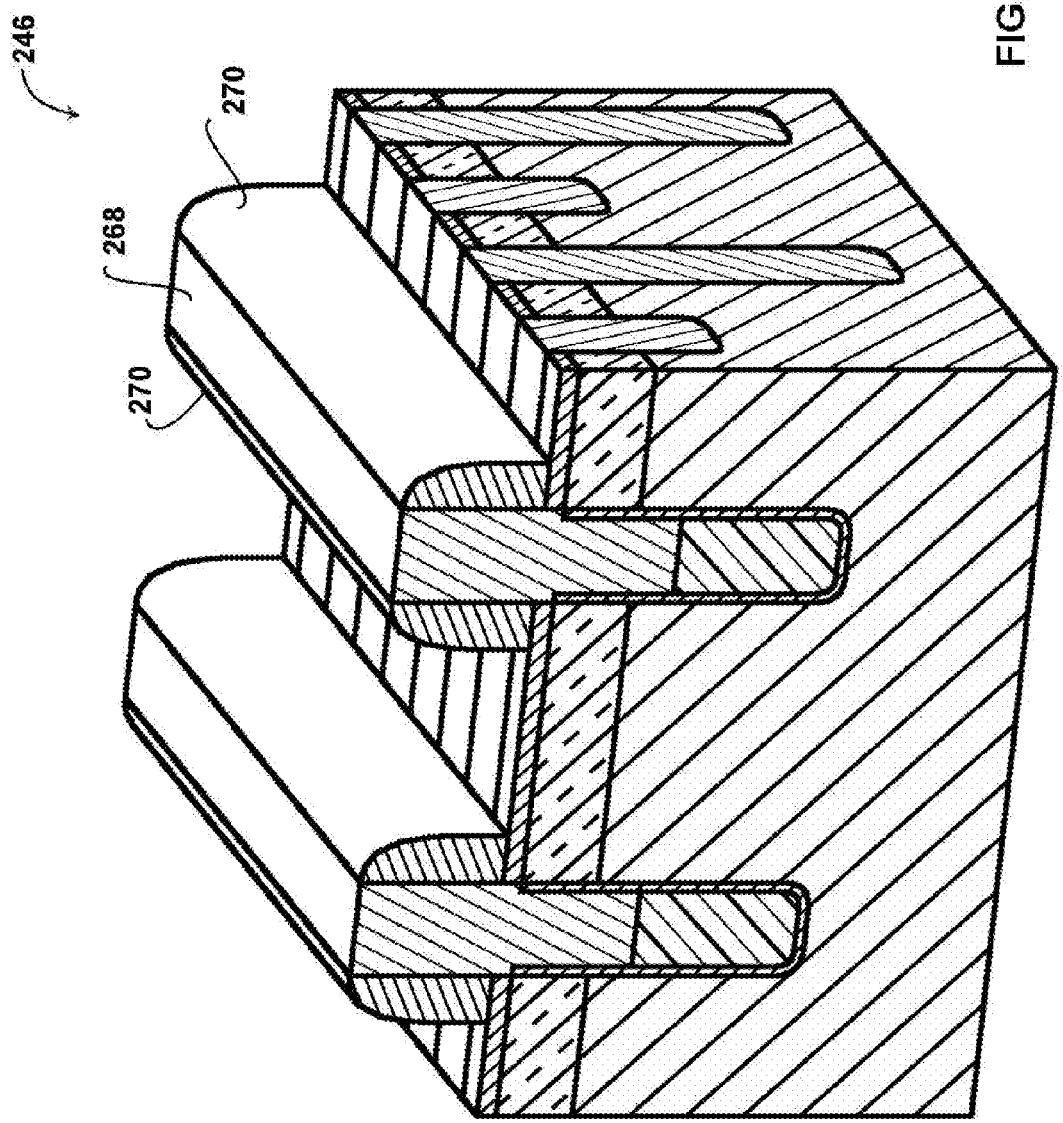

Subsequently, fin-mask spacers 270 may be created, as depicted by FIG. 41. The fin-mask spacers 270 may include oxide or other appropriate materials of a thickness selected to generally determine a width of subsequently-formed fins. To shape the fin-mask spacers 270, their components material or materials may be conformally deposited over the protective plugs 268 and spacer etched back with, for example, an anisotropic etch. After the spacer etch, the width of the fin-mask spacers 270 may generally determine the fin width.

Figure 42:
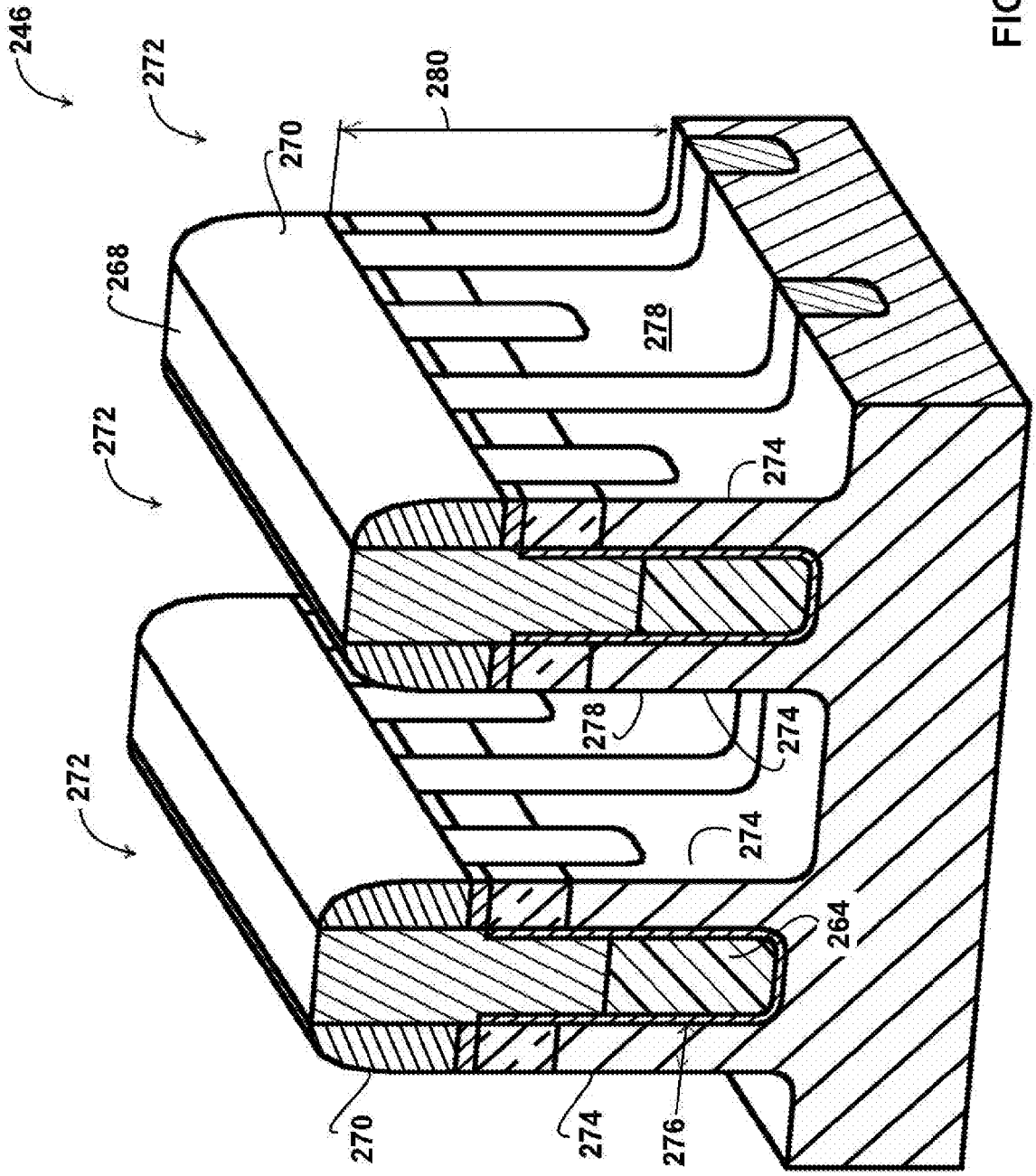

Next, using the fin-mask spacers 270 as a self-aligned hard mask, active-gate trenches 272 may be anisotropically etched or otherwise formed, as depicted by FIG. 42. The active-gate trenches 272 may be formed non-concurrently with the passive-gate trenches 258 (FIG. 36), e.g., after the passive-gate trenches 258 and, in some embodiments, after the passive gate 250.

Active-gate trenches 272 may extend in the X-direction, substantially parallel to, and interposed between, the passive-gate trenches 258 (now at least partially filled with the conductive material to create passive gates 264). The sidewalls of the active-gate trenches 272 may form active walls 278 of the fins 274. The active-gate trenches 272 may be deeper than the passive-gate trenches 258 (FIG. 36), as deep as the passive-gate trenches 258, or less deep than the passive-gate trenches 258.

The fin-mask spacers 270 may facilitate the formation of fins 274 with a fin width 276 smaller than the resolution limit of the equipment used to pattern other features on the substrate 246. For instance, the fin width 276 may be smaller than the resolution limit of a 193 nanometer lithography process or a 157 nanometer lithography process, either of which may include immersion lithography steps or double patterning. The fin width 276 may be less than 900 Å, 800 Å, 700 Å, 600 Å, 500 Å, 400 Å, 350 Å, 300 Å, 250 Å, 200 Å, 150 Å, or 100 Å, for instance.

During manufacturing, the passive gates 264 may mechanically support the fins 274. For example, in some embodiments, strain within the fins 274 during movement and/or immersion in liquids may be limited due to the passive gates 264 constraining movement of the fins 274. As a result, very thin, high aspect ratio fins 274 may be manufactured in some embodiments. For instance, the aspect ratio of the fins 274 (i.e., the ratio of fin height 280 to fin width 276) may be greater than 20 to 1, 15 to 1, 10 to 1, 9 to 1, 8 to 1, 7 to 1, 6 to 1, 5 to 1, 4 to 1, or 3 to 1. It should be noted, however, that the present technique is not limited to embodiments with passive gates, embodiments where the fins 274 are supported, or embodiments with thin, high aspect ratio fins.

Further, because the fin-mask spacers 270 may be formed on the sides of the protective plugs 268, the fin-mask spacers 270 may be self-aligned with the passive gates 264. In other embodiments, other self aligned, sub-photolithographic, direct patterning, or direct alignment techniques may be employed in accordance with embodiments of the present technique.

The fins 274 may have a generally uniform cross-section, such as a generally rectangular cross-section, a generally trapezoidal cross-section, or other cross-sectional shape, extending along at least a substantial portion their length in the y-direction, e.g., through one, two, five, or more transistor lengths. Of course, in some embodiments, the fin cross-section may vary along the length of the fin in the y-direction. For instance, the fin width 276 may vary or the fin height 280 may vary. The fin width 276 may be generally uniform in the Z-direction, or the fin width 276 may narrow or expand along the fin height 280. In some embodiments, the active wall 262 and passive wall 260 (FIG. 38) may generally slope or curve toward or away from each other (i.e., the fin width 276 may taper) along the fin height 280, in the Z-direction.

Figure 43:
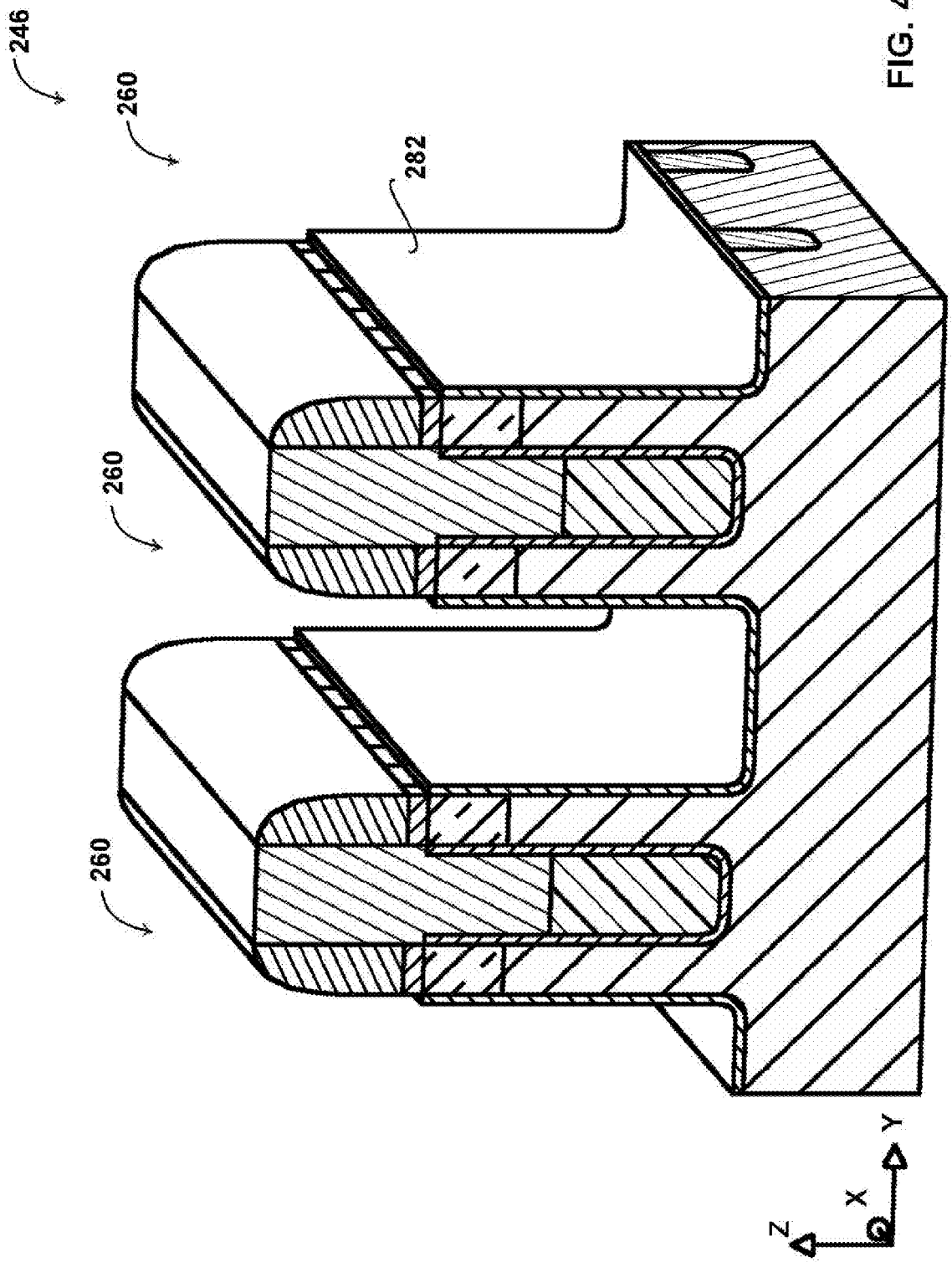

Next, an active-gate dielectric 282 may be formed in the active trenches 260, as depicted by FIG. 43. The active-gate dielectric 282 may be formed with a variety of processes and dielectric materials, such as those described above with reference to FIG. 19.

Figure 44:
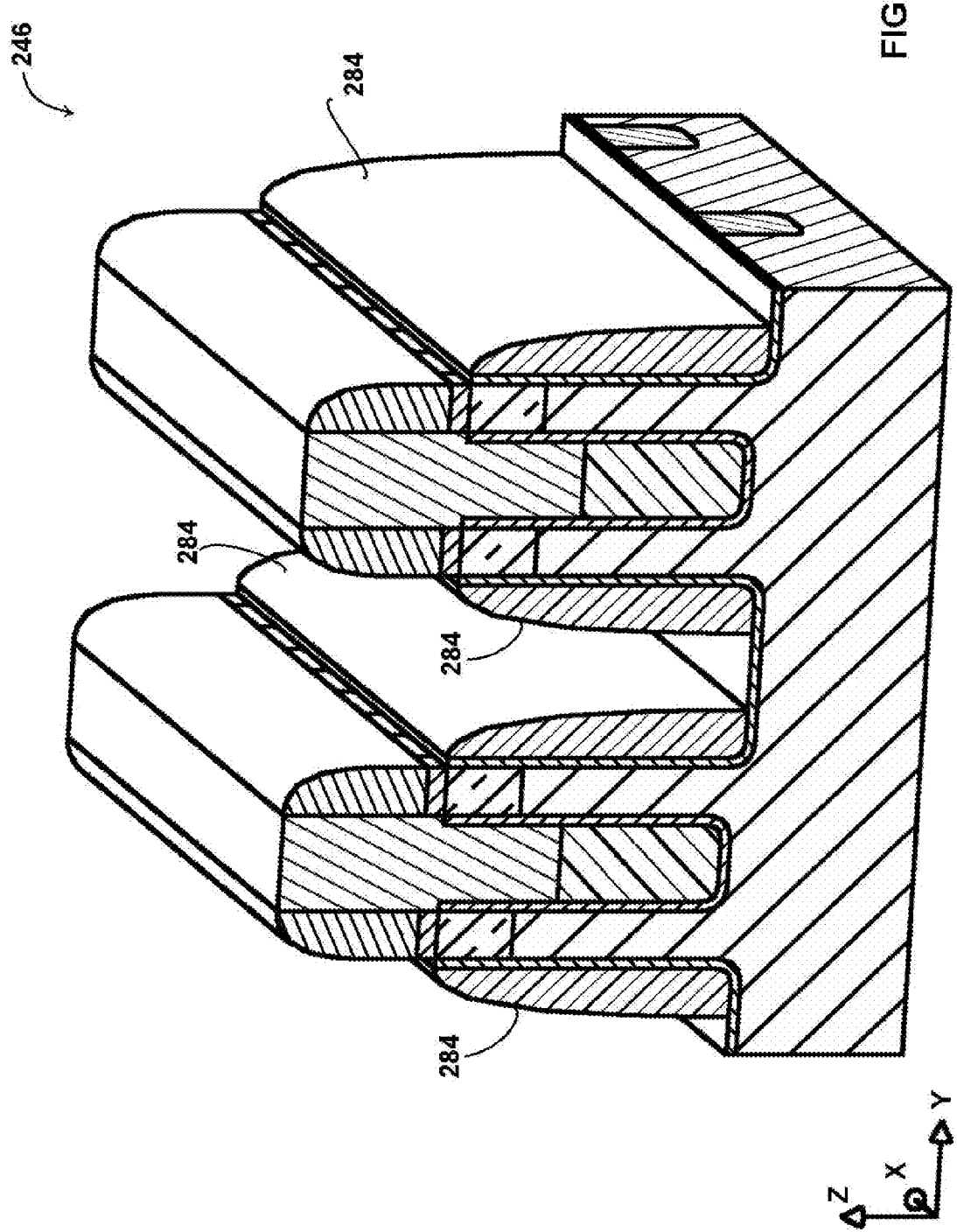

After forming the active-gate dielectric 282, active gates 284 may be formed, as illustrated by FIG. 44. The active gates 284 may be formed by blanket depositing a conductive material, such as titanium nitride, doped polysilicon, or other conductive material, and spacer etching the material to form the active gates 284. The active gates may be disposed next to the active walls 278 (FIG. 42) and may extend substantially parallel to the fins 274 (FIG. 42), in the X-direction. In other embodiments, the active gates 284 may be formed with the steps described above with respect to FIGS. 20-22.

Figure 45:
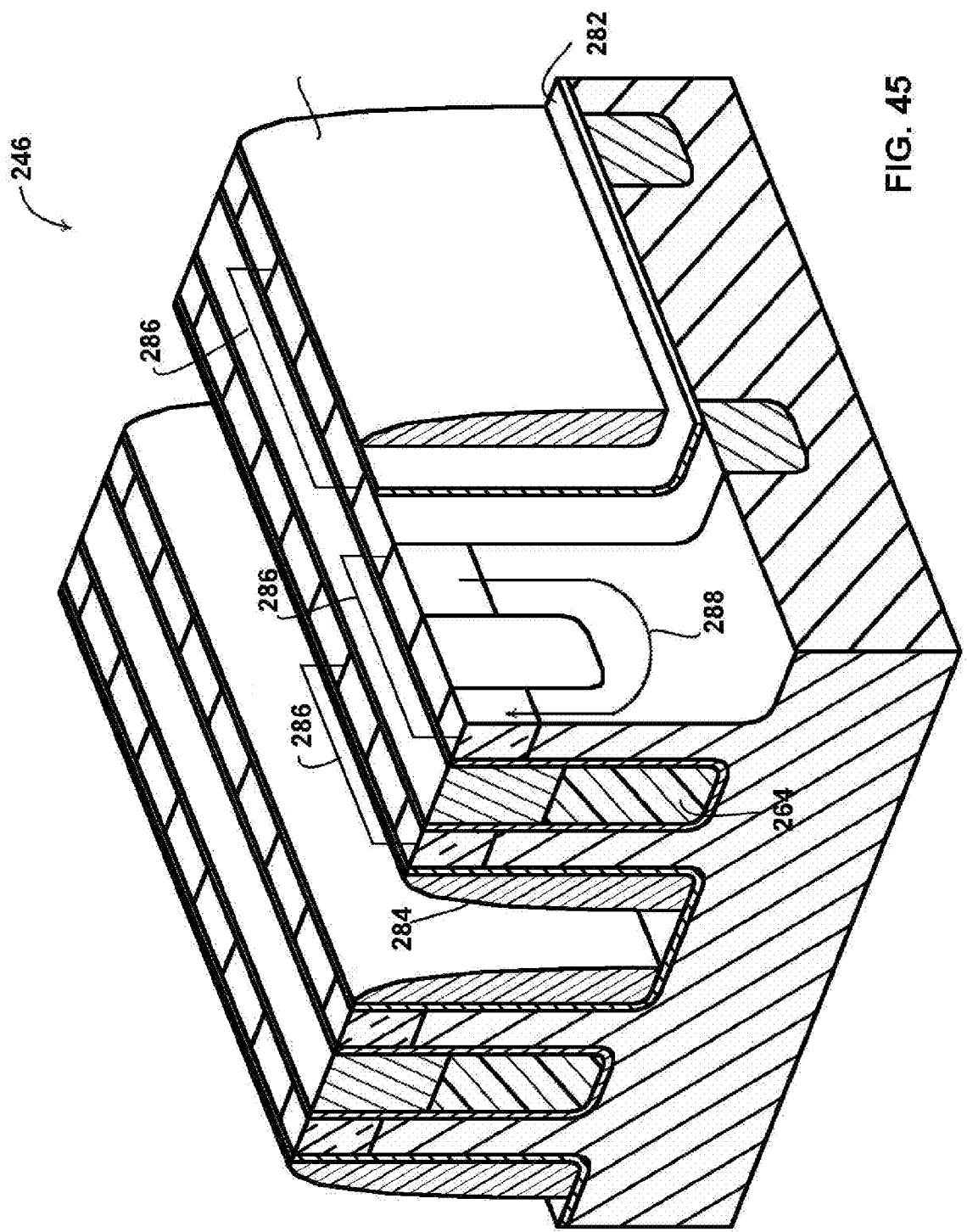

Next, the protective plugs 268 and the fin-mask spacers 270 (FIG. 41) may be removed to expose an array of transistors 286, as illustrated by FIG. 45. The protective plug 268 and fin-mask spacers 270 may be removed with an etch that is selective to these materials, with CMP, or with other processes. Two transistors 286 are disposed on each side of the passive gates 264, and the passive gates 264 extend between rows of transistors 286. The transistors 286 may be operated in a manner similar to the transistor 204 described above with respect to FIG. 25. The current flow through the transistors 286 is illustrated by an arrow 288 revealed by a cutaway portion of the active gate 284. Similarly, the passive gate 264 may be biased to adjust the threshold voltage of the transistors 286 and reduce GIDL, as described above.

In some embodiments, the transistor 286 (or the previously-described transistors 204 or 244) may be used to access a capacitor, a floating gate, or other volatile or non-volatile memory element. For example, a digit line may connect to one leg of the transistor 286, and a capacitor may connect to another leg, or vice versa. In this embodiment, active gate 284 may function as a word line. In operation, such an embodiment may access a memory element by turning on the transistor 286. For instance, the active gate 284 may be connected to a voltage source and the digit line coupled to a sense amp, or vice versa. Alternatively, the transistor 286 may be employed in some other type of electronic device. For example, the transistor 286 may be employed in a microprocessor, a digital signal processor, a programmable memory device, or an application specific integrated circuit, to name but a few.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
a transistor comprising:
a source;
a drain;
a channel region extending between and below the source and the drain, wherein the source and the drain are disposed vertically above the channel;
a gate disposed near the channel region on a first generally vertical sidewall of the transistor; and
a conductive member disposed on a second generally vertical sidewall of the transistor opposite of the channel region from the gate, wherein the conductive member does not overlap the source, the drain, or both the source and the drain, wherein the top of the conductive member is below the source and the drain.

2. The device of claim 1, wherein the conductive member does not overlap either the source or the drain.

3. The device of claim 1, wherein the conductive member is isolated from the channel by a dielectric.

4. The device of claim 1, wherein the transistor comprises:
a first leg rising generally vertically from a substrate; and
a second leg rising generally vertically from the substrate.

5. The device of claim 4, wherein the source is disposed near a distal portion of the first leg and the drain is disposed near a distal portion of the second leg.

6. The device of claim 1, wherein the conductive member and the gate are shared by a row of transistors.

7. The device of claim 6, wherein the conductive member is coupled to other conductive members shared by other rows of transistors.

8. The device of claim 6, wherein the gate is not coupled to gates shared by other rows of transistors.

* * * * *